United States Patent
Stevens et al.

(10) Patent No.: US 10,170,274 B2
(45) Date of Patent: *Jan. 1, 2019

(54) TEM PHASE CONTRAST IMAGING WITH IMAGE PLANE PHASE GRATING

(71) Applicant: Battelle Memorial Institute, Richland, WA (US)

(72) Inventors: Andrew J. Stevens, Richland, WA (US); Libor Kovarik, West Richland, WA (US); Nigel D. Browning, Richland, WA (US)

(73) Assignee: Battelle Memorial Institute, Richland, WA (US)

(*) Notice: Subject to any disclaimer, the term of this patent is extended or adjusted under 35 U.S.C. 154(b) by 0 days.

This patent is subject to a terminal disclaimer.

(21) Appl. No.: 15/286,502

(22) Filed: Oct. 5, 2016

(65) Prior Publication Data

US 2017/0025247 A1 Jan. 26, 2017

Related U.S. Application Data

(63) Continuation-in-part of application No. 15/075,031, filed on Mar. 18, 2016, and a continuation-in-part of
(Continued)

(51) Int. Cl.
*H01J 37/26* (2006.01)
*H01J 37/28* (2006.01)
(Continued)

(52) U.S. Cl.
CPC .............. *H01J 37/222* (2013.01); *G01T 1/00* (2013.01); *G03F 7/20* (2013.01); *G03F 7/30* (2013.01);
(Continued)

(58) Field of Classification Search
CPC .......... H01J 37/26; H01J 37/28; H01J 37/263; H01J 37/023; H01J 37/147; H01J 37/22;
(Continued)

(56) References Cited

U.S. PATENT DOCUMENTS 3,633,037 A * 1/1972 Langenbeck .......... D06H 3/125
250/395
5,004,918 A * 4/1991 Tsuno ................... H01J 37/222
250/307
(Continued)

FOREIGN PATENT DOCUMENTS

WO   WO 2015-061037   4/2015

OTHER PUBLICATIONS

Llull et al. "Coded aperture compressive temporal imaging", Optics Express, vol. 21. No. 9, May 6, 2013, 10526-10545.*
(Continued)

*Primary Examiner* — David A Vanore
(74) *Attorney, Agent, or Firm* — Klarquist Sparkman, LLP

(57) ABSTRACT

Transmission microscopy imaging systems include a mask and/or other modulator situated to encode image beams, e.g., by deflecting the image beam with respect to the mask and/or sensor. The beam is modulated/masked either before or after transmission through a sample to induce a spatially and/or temporally encoded signal by modifying any of the beam/image components including the phase/coherence, intensity, or position of the beam at the sensor. For example, a mask can be placed/translated through the beam so that several masked beams are received by a sensor during a single sensor integration time. Images associated with multiple mask displacements are then used to reconstruct a video sequence using a compressive sensing method. Another example of masked modulation involves a mechanism for phase-retrieval, whereby the beam is modulated by a set of different masks in the image plane and each masked image is recorded in the diffraction plane.

29 Claims, 23 Drawing Sheets

Related U.S. Application Data application No. PCT/US2016/023286, filed on Mar. 18, 2016, and a continuation-in-part of application No. 15/075,015, filed on Mar. 18, 2016.

(60) Provisional application No. 62/134,932, filed on Mar. 18, 2015, provisional application No. 62/148,619, filed on Apr. 16, 2015.

(51) Int. Cl.
| | |
|---|---|
| *H01J 37/22* | (2006.01) |
| *H01J 37/09* | (2006.01) |
| *H01J 37/20* | (2006.01) |
| *G01T 1/00* | (2006.01) |
| *G03F 7/20* | (2006.01) |
| *G03F 7/30* | (2006.01) |
| *H01J 37/244* | (2006.01) |

(52) U.S. Cl.
CPC ............ *H01J 37/09* (2013.01); *H01J 37/20* (2013.01); *H01J 37/244* (2013.01); *H01J 37/26* (2013.01); *H01J 37/28* (2013.01); *H01J 2237/0453* (2013.01); *H01J 2237/226* (2013.01); *H01J 2237/24455* (2013.01); *H01J 2237/2802* (2013.01)

(58) Field of Classification Search
CPC  G02B 21/0032; G02B 21/0064; G02B 26/06; G02B 27/46
USPC .............. 250/306, 307, 310, 311, 334, 395, 250/396 ML, 396 R, 397, 492.1, 559.06, 250/559.07
See application file for complete search history.

(56) References Cited

U.S. PATENT DOCUMENTS

| | | | | |
|---|---|---|---|---|
| 5,051,585 | A * | 9/1991 | Koshishiba | G03F 1/86 250/310 |
| 5,258,246 | A | 11/1993 | Berger et al. | |
| 5,298,747 | A * | 3/1994 | Ichikawa | H01J 37/28 250/307 |
| 5,395,738 | A | 3/1995 | Brades et al. | |
| 5,401,932 | A | 3/1995 | Hashimoto et al. | |
| 6,124,063 | A | 9/2000 | Dauksher | |
| 6,310,341 | B1 * | 10/2001 | Todokoro | H01J 37/05 250/305 |
| 6,812,473 | B1 | 11/2004 | Amemiya | |
| 7,417,227 | B2 * | 8/2008 | Matsumoto | H01J 37/244 250/306 |
| 7,465,923 | B2 | 12/2008 | Nishiumi et al. | |
| 7,825,378 | B2 * | 11/2010 | Yakushevska | H01J 37/263 250/306 |
| 7,834,795 | B1 * | 11/2010 | Dudgeon | H03M 7/30 341/155 |
| 7,928,376 | B2 | 4/2011 | Kaji et al. | |
| 8,125,549 | B2 * | 2/2012 | Dekel | H04N 5/335 348/294 |
| 8,190,007 | B2 * | 5/2012 | Meijer | G03B 15/05 396/21 |
| 8,217,352 | B2 * | 7/2012 | Reed | H01J 37/04 250/306 |
| 8,334,512 | B2 * | 12/2012 | Luecken | H01J 37/05 250/305 |
| 8,338,782 | B2 * | 12/2012 | Luecken | H01J 37/222 250/310 |
| 8,553,994 | B2 * | 10/2013 | Tian | H04N 19/60 382/232 |
| 8,648,955 | B2 * | 2/2014 | Kang | G02B 27/46 348/335 |
| 8,725,784 | B2 * | 5/2014 | Davenport | H03M 7/30 708/300 |
| 8,748,818 | B2 * | 6/2014 | Own | H01J 37/153 250/306 |
| 8,772,716 | B2 | 7/2014 | Buijsse | |
| 8,785,850 | B2 | 7/2014 | Malac et al. | |
| 8,829,436 | B2 | 9/2014 | Iijima et al. | |
| 8,907,280 | B1 * | 12/2014 | Larson | G01N 23/225 250/307 |
| 8,933,401 | B1 * | 1/2015 | Reed | H01J 37/28 250/306 |
| 9,040,911 | B2 | 5/2015 | Ogashiwa et al. | |
| 9,129,774 | B2 * | 9/2015 | Buijsse | H01J 37/263 |
| 9,165,743 | B2 * | 10/2015 | Reed | H01J 37/265 |
| 9,412,558 | B2 * | 8/2016 | Van Dyck | H01J 37/26 |
| 9,620,330 | B2 * | 4/2017 | Potoček | H01J 37/222 |
| 2001/0054697 | A1 | 12/2001 | Yamashita | |
| 2002/0148962 | A1 * | 10/2002 | Hosokawa | H01J 37/26 250/311 |
| 2003/0006373 | A1 * | 1/2003 | Koguchi | H01J 37/2955 250/311 |
| 2005/0220266 | A1 | 10/2005 | Hirsch | |
| 2006/0239336 | A1 * | 10/2006 | Baraniuk | H04L 25/20 375/216 |
| 2007/0228277 | A1 | 10/2007 | Tsuneta et al. | |
| 2007/0284528 | A1 * | 12/2007 | Benner | G01N 23/04 250/311 |
| 2008/0203296 | A1 | 8/2008 | Terada et al. | |
| 2008/0254376 | A1 | 10/2008 | Lin et al. | |
| 2009/0200464 | A1 * | 8/2009 | Tiemeijer | H01J 37/153 250/307 |
| 2010/0252735 | A1 * | 10/2010 | Hytch | H01J 37/26 250/311 |
| 2011/0168903 | A1 | 7/2011 | Kyele et al. | |
| 2011/0192976 | A1 * | 8/2011 | Own | H01J 37/153 250/311 |
| 2011/0210249 | A1 * | 9/2011 | Benner | H01J 37/26 250/310 |
| 2011/0220796 | A1 | 9/2011 | Nicolopoulos | |
| 2012/0049060 | A1 | 3/2012 | Luecken et al. | |
| 2012/0123581 | A1 * | 5/2012 | Smilde | G03F 7/70483 700/105 |
| 2013/0099115 | A1 | 4/2013 | Glaeser et al. | |
| 2013/0126729 | A1 * | 5/2013 | Own | H01J 37/261 250/307 |
| 2013/0193322 | A1 * | 8/2013 | Blackburn | H01J 37/147 250/311 |
| 2014/0061463 | A1 | 3/2014 | Buijsse et al. | |
| 2014/0138542 | A1 | 5/2014 | Inada et al. | |
| 2014/0140375 | A1 | 5/2014 | Muqaibel et al. | |
| 2014/0166880 | A1 | 6/2014 | Shiue et al. | |
| 2014/0224988 | A1 | 8/2014 | Tamaki et al. | |
| 2015/0055745 | A1 | 2/2015 | Holzner et al. | |
| 2015/0069233 | A1 | 3/2015 | Anderson et al. | |
| 2015/0243474 | A1 * | 8/2015 | Lazic | H01J 37/244 250/307 |
| 2015/0351705 | A1 | 12/2015 | Brady et al. | |
| 2015/0371815 | A1 * | 12/2015 | Potocek | G02B 21/0048 250/307 |
| 2016/0111247 | A1 | 4/2016 | Potocek et al. | |
| 2016/0276129 | A1 * | 9/2016 | Stevens | G03F 7/20 |
| 2016/0301915 | A1 * | 10/2016 | Shechtman | G02B 21/0064 |
| 2017/0025247 | A1 | 1/2017 | Stevens et al. | |
| 2017/0146787 | A1 * | 5/2017 | Reed | G02B 21/365 |

OTHER PUBLICATIONS

Arons et al., "Einstein's Proposal of the Photon Concept—a Translation of the Annalen der Physik Paper of 1905," *American Journal of Physics*, 33(5):367-374 (May 1965).

Gren et al., "Über einen die Erzeugung and Verwandlung des Lichtes betreffenden heuristischen Gesichtspunkt," Annalen der Physik, 14(S1):164-18 (2005).

Kanaya et al., "Penetration and energy-loss theory of electrons in solid targets," *Journal of Physics D: Applied Physics*, 5(1):43 (Jan. 1972).

Kanaya et al., "Secondary electron emission due to primary and backscattered electrons," Journal of Physics D: Applied Physics, 5(9):1727 (1972).

(56) References Cited

OTHER PUBLICATIONS

Nichelatti, et al., "Photoluminescence from colour centres generated in lithium flouride thin films and crystals by extreme-ultraviolet irradiation," *Nuclear Intruments and Methods in Physics Research B*, 268(19):3035-3059 (May 16, 2010).
Seitz, "Color Center in Alkali Halide Crystals," Reviews of Modern Physics, pp. 384-408 (1946).
International Search Report and Written Opinion from International Application No. PCT/US2016/023286, dated Aug. 5, 2016, 10 pages.
Aharon et al., "A: K-SVD: An Algorithm for Designing Overcomplete Dictionaries for Sparse Representation," *IEEE Trans. Signal Process.*, 54:4311-4322 (Nov. 2006).
Baraniuk et al., "A Simple Proof of the Restricted Isometry Property for Random Matrices," *Constructive Approximation*, 28:253-263 (Dec. 2008).
Baraniuk, "Compressive Sensing," *IEEE Signal Process. Mag.*, 24, 9 pages (Jul. 2007).
Binev et al., "Compressed Sensing and Electron Microscopy," Vogt et al. (eds.), *Modeling Nanoscale Imaging in Electron Microscopy, Nanostructure Science and Technology*, Springer, pp. 73-126 (Feb. 2012).
Binev et al., "High-Quality Image Formation by Nonlocal Means Applied to High-Angle Annular Dark-Field Scanning Transmission Electron Microscopy (HAADF-STEM)," Vogt et al. (eds.), *Modeling Nanoscale Imaging in Electron Microscopy. Nanostructure Science and Technology*, Springer, pp. 127-145 (Jan. 2012).
Bioucas-Dias et al., "Two-Step Iterative Shrinkage/Thresholding Algorithms for Image Restoration," *IEEE Trans, Image Process.*, 16:2992-3004 (Nov. 2007).
Brand et al., "Super-resolution in optical data storage." *Journal of Optics A: Pure and Applied Optics* 1: 794 (Nov. 1999).
Candés et al., "Uncertainty Principles: Exact Signal Reconstruction from Highly Incomplete Frequency Information," *IEEE Trans, Inform. Theory*, 52:489-509, (Jan. 2006).
Candés, "The Restricted Isometry Property and its Implications for Compressed Sensing," *Comptes Rendus Mathematique*, 346:589-592 (May 2008).
Candés et al., "Towards a Mathematical Theory of Super-resolution." *Communications on Pure and Applied Mathematics* 67: 906-956 (Mar. 2012).
Chen et al., "Compressive Sensing on Manifolds Using a Nonparametric Mixture of Factor Analyzers: Algorithm and Performance Bounds," *IEEE Trans, Signal Process.*, 58:6140-6155 (Dec. 2010).
DeLaRiva et al., "In-Situ Transmission Electron Microscopy of Catalyst Sintering," *Catalysis*, 308:291-305 (Sep. 2013).
Donoho, "Compressed Sensing," *IEEE Trans, Inform. Theory*, 52:1289-1306, (Apr. 2006).
Evans et al., "Controlled Growth of Nanoparticles from Solution with In-Situ Liquid Transmission Electron Microscopy," *Nano Lett.* 11:2809-2813 (Jul. 2011).
Fernandez-Granda, "Super-resolution and compressed sensing." *SIAM News* 46 (Oct. 2013).
Ferreira et al., "In-Situ Transmission Electron Microscopy," *MRS Bull.* 33:83-90 (Feb. 2008).
Foucart et al., "A Mathematical Introduction to Compressive Sensing," Springer, New York, 634 pages (Aug. 2013).
Gatan, "TEM Imaging & Spectroscopy," http://www.gatan.com/products/tem-imaging-spectroscopy, accessed Dec. 19, 2014, 5 pages.
Gershman et al., "A Tutorial on Bayesian Nonparametric Models," *J. Math. Psychol.* 56:1-12 (Feb. 2012).
Ghahramani et al., "The EM Algorithm for Mixtures of Factor Analyzers," Technical Report CRG-TR-96-1, University of Toronto, 8 pages (May 1996).
Goris et al., "Electron Tomography Based on a Total Variation Minimization Reconstruction Technique," *Ultramicroscopy*, 113:120-130 (Feb. 2012).
Griffiths et al., "The Indian Buffet Process: An Introduction and Review," *J. Mach. Learn. Res.*, 12:1185-1224 (Apr. 2011).

Haider et al., "Towards 0.1 nm Resolution with the First Spherically Corrected Transmission Electron Microscope," *J Electron. Microsc.* (Tokyo), 47:395-405 (Jan. 1998).
He et al., "Face Recognition Using Laplacianfaces," *IEEE Trans, Pattern Anal. Mach. Intell.*, 27:328-340 (Jan. 2005).
Huang et al., "In-Situ Observation of the Electrochemical Lithiation of a Single $SnO_2$ Nanowire Electrode," *Science*, 330:1515-1520 (Dec. 2010).
Jinschek et al., "Image Resolution and Sensitivity in an Environmental Transmission Electron Microscope," *Micron.* 43:1156-1168 (Nov. 2012).
Jinschek, "Advances in the Environmental Transmission Electron Microscope (etem) for Nanoscale In-Situ Studies of Gas-Solid Interactions," *Chem. Commun.*, 50:2696-2706 (Jan. 2014).
Kraemer et al., "Ultra high-density optical data storage: information retrieval an order of magnitude beyond the Rayleigh limit." *Chemical physics* 285: 73-83 (Dec. 2002).
Liao et al., "Generalized Alternating Projection for Weighted-$f_{2,1}$ Minimization with Applications to Model-Based Compressive Sensing," *SIAM J. Imaging Sci*, 7:797-823 (Apr. 2014).
Llull et al., "Coded Aperture Compressive Temporal Imaging," *Opt. Express*, 21:10526-10545 (Apr. 2013).
Mairal et al., "Sparse Modeling for Image and Vision Processing," arXiv preprint arXiv:1411.3230, 205 pages (Dec. 2014).
McMullan et al., "Comparison of Optimal Performance at 300 keV of Three Direct Electron Detectors for Use in Low Dose Electron Microscopy," *Ultramicroscopy*, 147:156-163 (Dec. 2014).
Mehraeen et al., "A (S)TEM Gas Cell Holder with Localized Laser Heating for In-Situ Experiments," *Microscopy Microanal*, 19:470-478 (Apr. 2013).
Neal, "Markov Chain Sampling Methods for Dirichlet Process Mixture Models," *J. Comput. Graph. Stat.*, 9:249-265 (Feb. 2000).
Olshausen et al., "Emergence of Simple-Cell Receptive Field Properties by Learning a Sparse Code for Natural Images," *Nature*, 381:607-609 (Jun. 1996).
Rasmussen, "The Infinite Gaussian Mixture Model," *in NIPS*, pp. 554-560, Denver, CO (1999).
Saghi et al., "Reduced-Dose and High-Speed Acquisition Strategies for Multi-Dimensional Electron Microscopy," *Adv. Struct. Chem. Imaging*, 10 pages (May 2015).
Stevens et al., "The Potential for Bayesian Compressive Sensing to Significantly Reduce Electron Dose in High-Resolution STEM Images," *Microscopy*, 63:41-51 (Oct. 2013).
Surrey et al., "Quantitative Measurement of the Surface Self-Diffusion on Au Nanoparticles by Aberration-Corrected Transmission Electron Microscopy," *Nano Lett.*, 12:6071-6077 (Nov. 2012).
Tipping et al., "Mixtures of Probabilistic Principal Component Analyzers," *Neural Comput.*, 11:443-482 (Feb. 1999).
Tipping et al., "Probabilistic Principal Component Analysis," *J. R. Stat. Soc. Series B (Stat. Methodol.)*, 61:611-622 (1999).
Tsyganov et al., "Analysis of Ni Nanoparticle Gas Phase Sintering," *Phys. Rev. B.*, 75, 9 pages (Jan. 2007).
Wakin, Manifold-Based Signal Recovery and Parameter Estimation From Compressive Measurements, arXiv preprint arXiv:1002.1247, 22 pages (Feb. 2010).
Xing et al., "Dictionary Learning for Noisy and Incomplete Hyperspectral Images," *SIAM J. Imaging Sci.* 5:33-56 (Jan. 2012).
Yang et al., "Gaussian Mixture Model for Video Compressive Sensing," 2013 20th *IEEE International Conference on Image Processing (ICIP)*, pp. 19-23 (Sep. 2013).
Yoshida et al., "Visualizing Gas Molecules Interacting with Supported Nanoparticulate Catalysts at Reaction Conditions," *Science*, 335:317-319 (Jan. 2012).
Yuan et al., "Adaptive Temporal Compressive Sensing for Video," 2013 20th *IEEE International Conference on Image Processing (ICIP)*, Melbourne, Australia, pp. 14-18 (Sep. 2013).
Yuan et al., "Low-Cost Compressive Sensing for Color Video and Depth," 2014 *IEEE Conference on Computer Vision and Pattern Recognition (CVPR)*, IEEE, arXiv:1402.6932v1, 8 pages (Jun. 2014).
Zhou et al., "Nonparametric Bayesian Dictionary Learning for Analysis of Noisy and Incomplete Images," *IEEE Trans. Image Process.*, 21:130-144 (Jan. 2012).

(56) References Cited

OTHER PUBLICATIONS

International Search Report and Written Opinion from International Application No. PCT/US2017/026664, dated Sep. 18, 2017, 15 pages.

\* cited by examiner

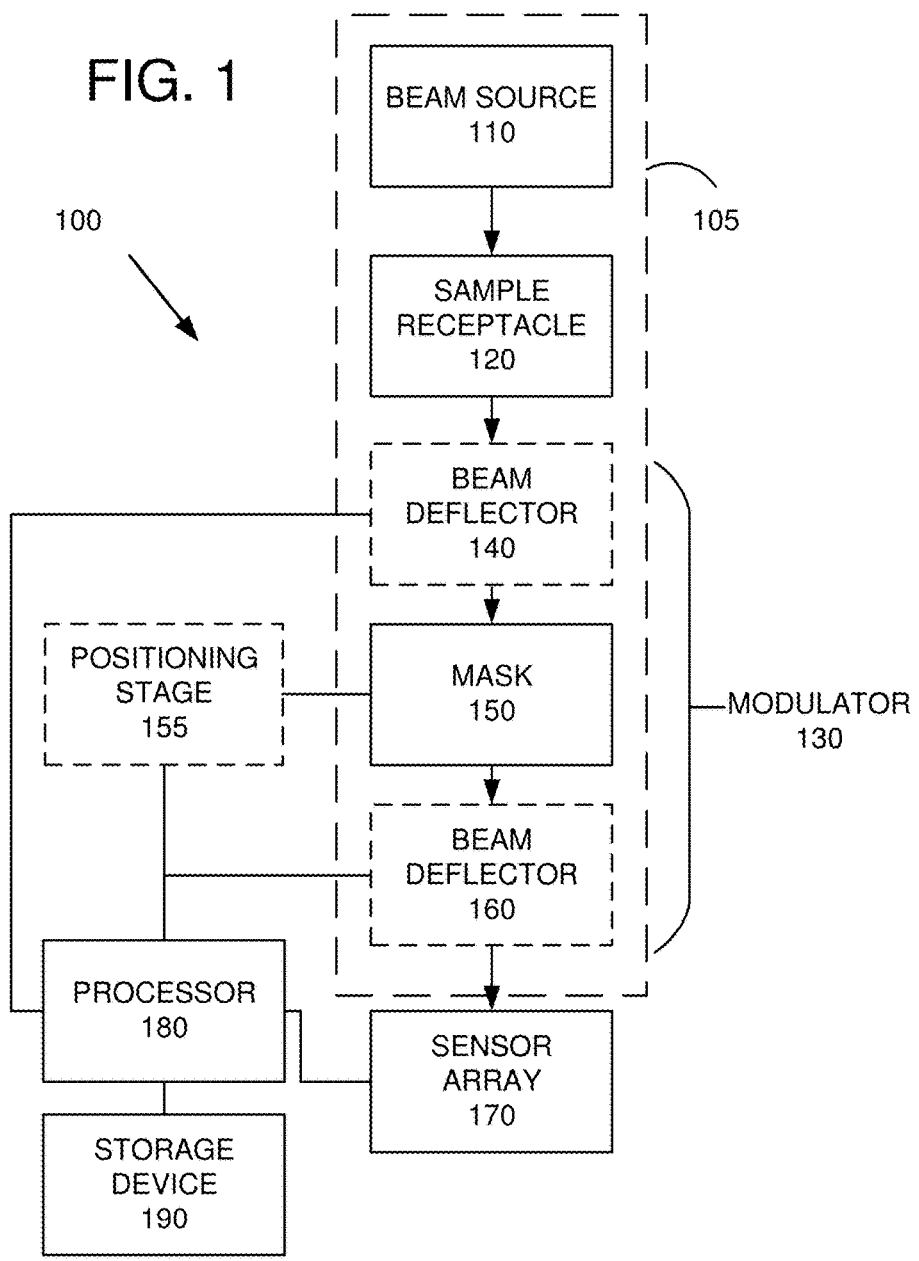

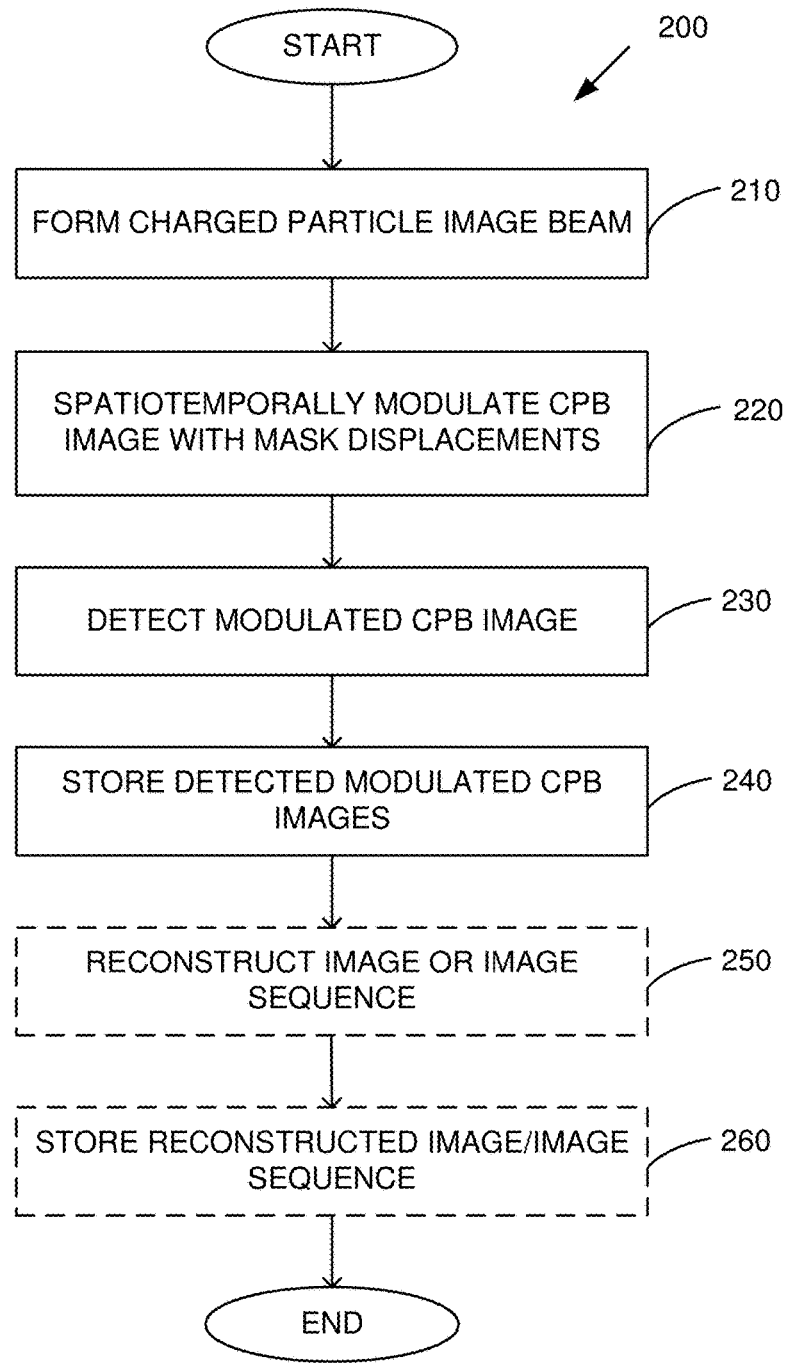

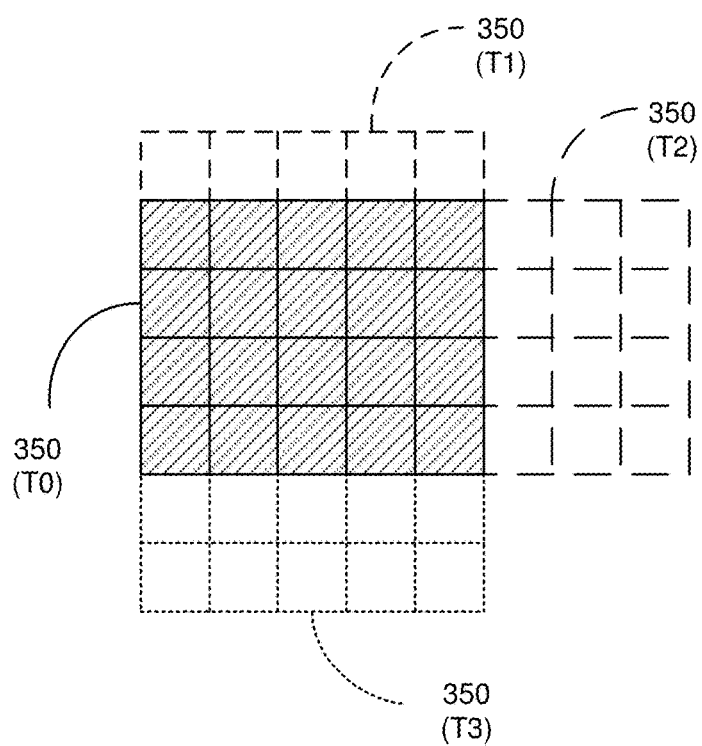

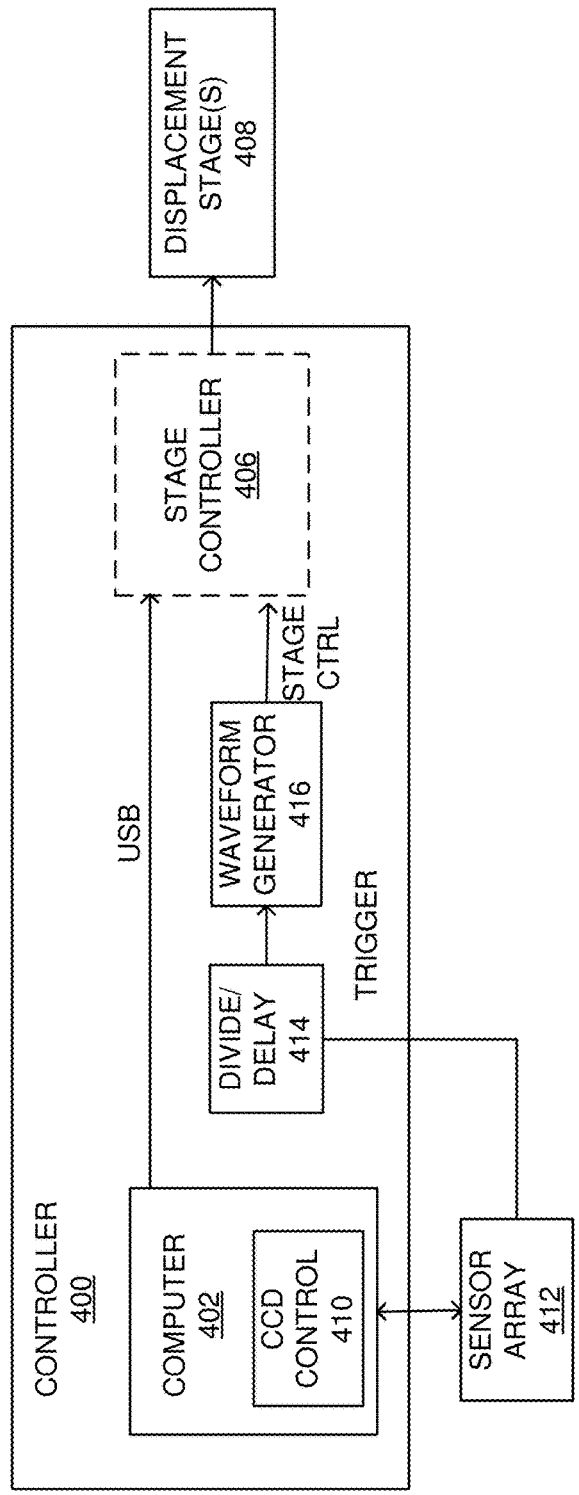

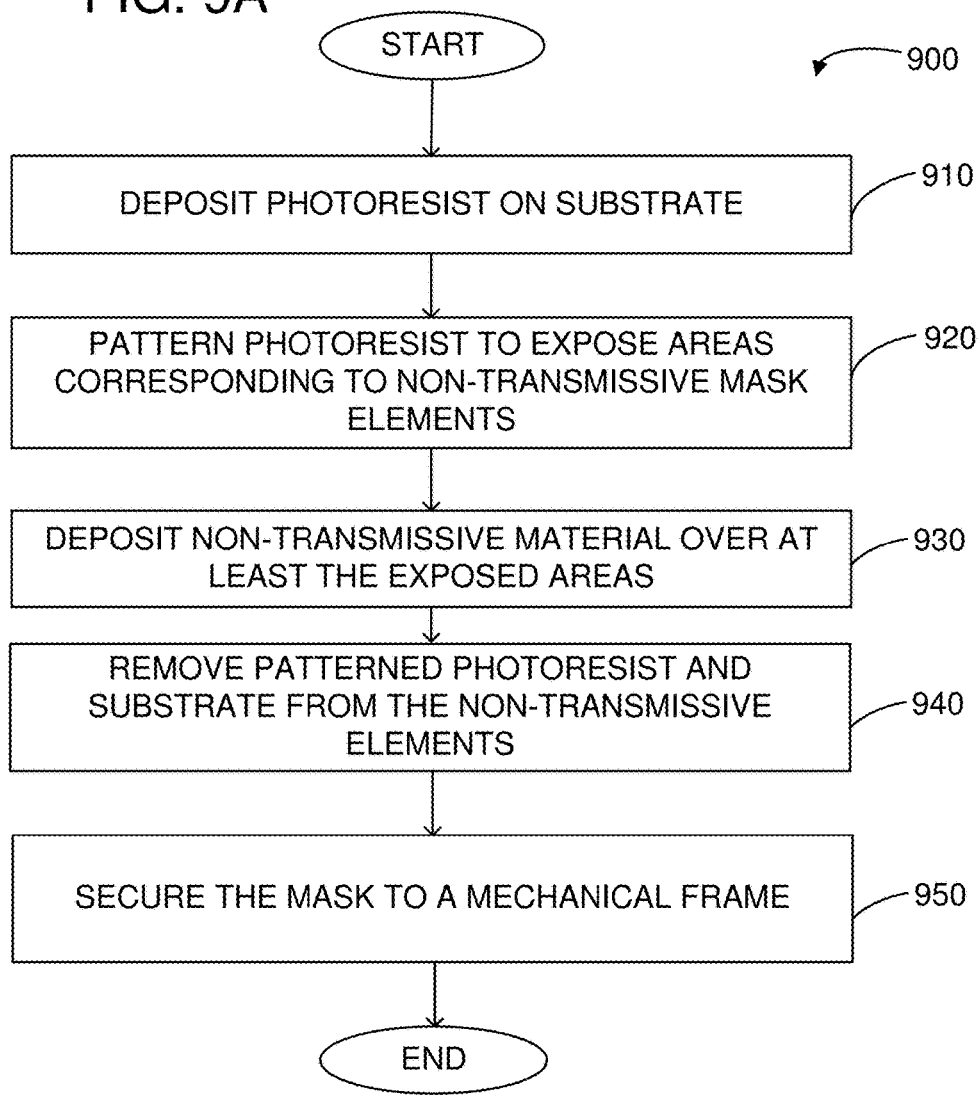

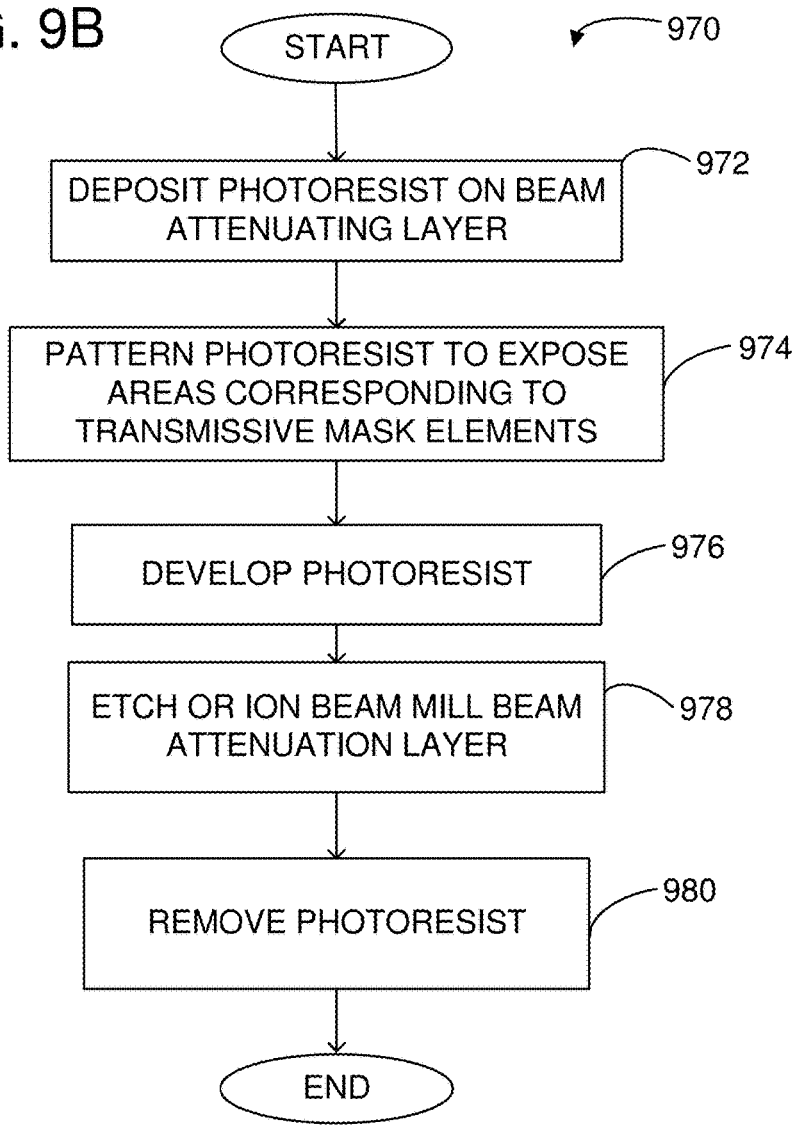

FIG. 11A
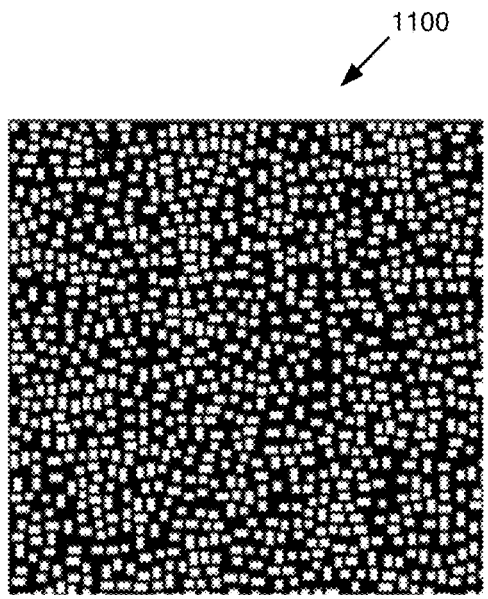
FIG. 11B
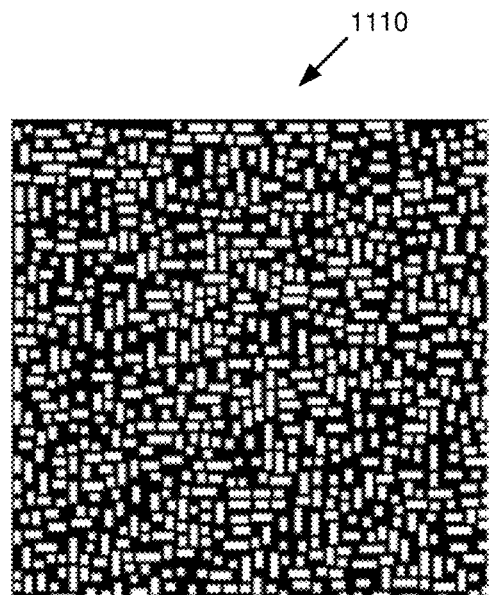
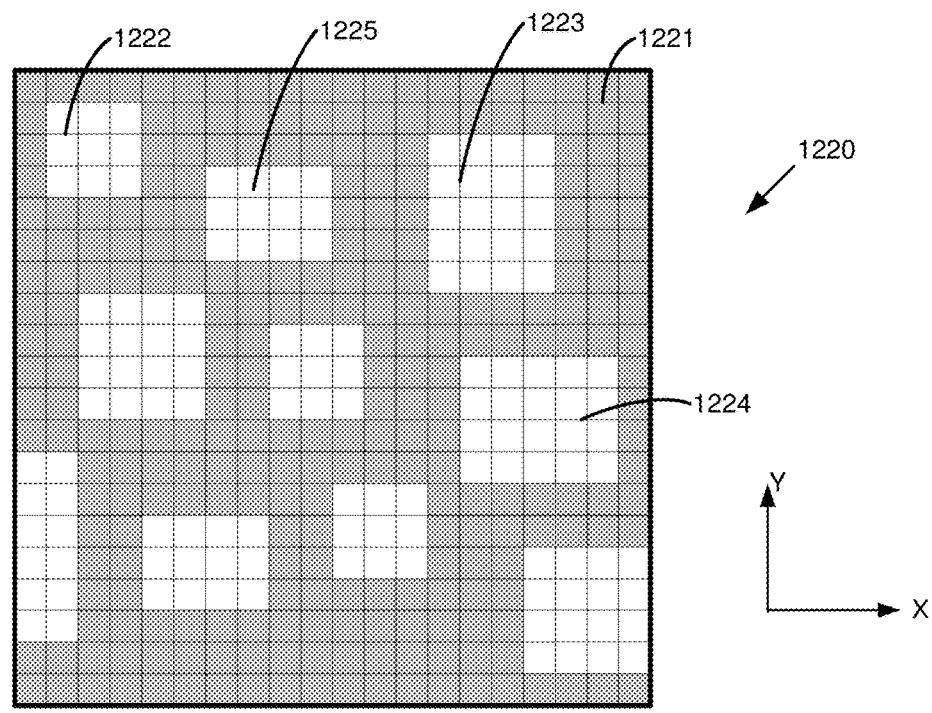
FIG. 12

FIG. 16
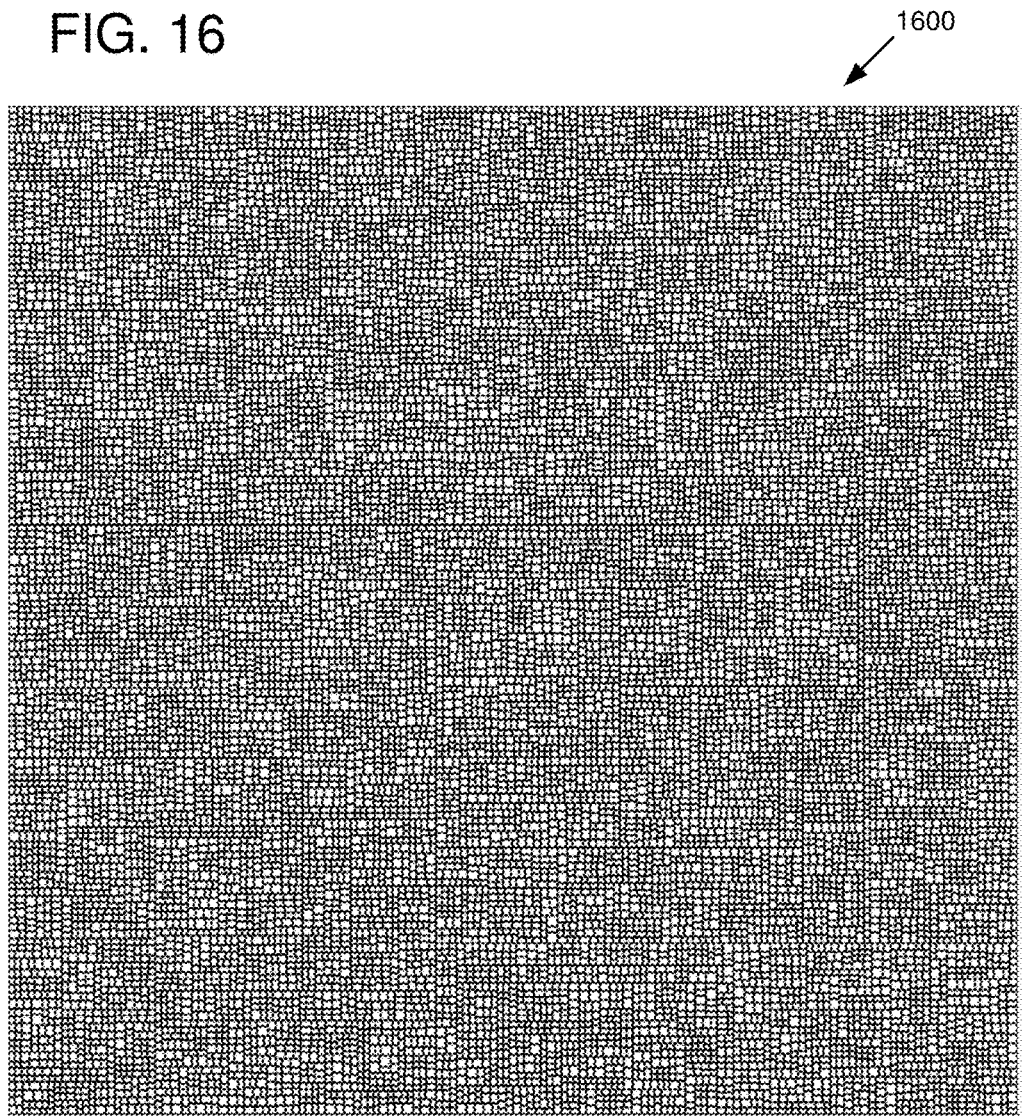
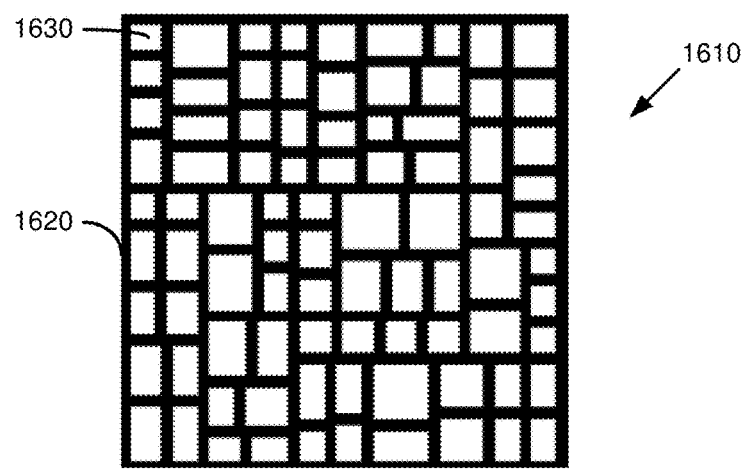

TEM PHASE CONTRAST IMAGING WITH IMAGE PLANE PHASE GRATING

CROSS REFERENCE TO RELATED APPLICATIONS

This application is a continuation-in-part of U.S. patent application Ser. No. 15/075,031, filed Mar. 18, 2016, International Patent Application No. PCT/US2016/023286, filed Mar. 18, 2016, and U.S. patent application Ser. No. 15/075,015, filed Mar. 18, 2016, all of which claim the benefit of U.S. Provisional Patent Application No. 62/134,932, filed Mar. 18, 2015, and U.S. Provisional Patent Application No. 62/148,619, filed Apr. 16, 2015. The entire disclosures of these applications are incorporated herein by reference.

ACKNOWLEDGMENT OF GOVERNMENT SUPPORT

This invention was made with government support under grants DE-FG02-03ER46057 and DE-AC05-76RL01830 awarded by the United States Department of Energy. The government has certain rights in the invention.

BACKGROUND

In-situ transmission electron microscopy (TEM) can be a powerful analytical technique for enabling insight into the nature of materials under a broad range of environmental conditions. With the development of a wide range of in-situ TEM stages and dedicated environmental TEM, it is possible to image materials under high-temperature, gas, and liquid conditions, as well as in other complex electrochemical, optical, and mechanical settings. In many of these applications, it may be desirable to capture the dynamic evolution of the microstructure with a high spatial and temporal resolution. While many developments in electron optics and the design of in-situ cells have been made, leading to significant improvements in achievable resolution, there are still many challenges associated with capturing dynamic processes with high temporal resolution.

In-situ TEM video capture can be performed with charge-coupled device (CCD) cameras. High-performance commercially available CCD cameras have readout rates in the range of a few tens of MB/s, which under appropriate binning conditions can provide a video acquisition period of around 30 ms. The introduction of direct detection cameras (DDCs) based on CMOS technology can provide an order of magnitude increase in readout rate, such that these cameras can be operated in the millisecond range. DDCs permit direct sensing of electrons without the use of a scintillator to provide electron-to-light conversion and can achieve greater sensitivity than that available using CCDs. While improving temporal resolution, DDCs can also enable electron dose reduction, another challenge for in-situ TEM imaging. A potential limitation is that as frame rates increase, image read-out can become a challenge due to the increased data rates.

SUMMARY

Imaging system comprise a modulator situated to receive a radiation beam and generate a mask-modulated radiation beam based on a relative displacement of a mask and a sample. A sensor is situated to receive the mask-modulated radiation beam. In some examples, the mask comprises a plurality of transmissive and non-transmissive elements having a predetermined width and length, and the modulator is configured to produce a displacement of the radiation image beam with respect to the mask by at least the predetermined width or the predetermined length. In other examples, the sensor is a sensor array. In further examples, the radiation beam is one of an X-ray beam, a gamma ray beam, a charged particle beam (CPB), an infrared beam, and an ultraviolet beam. In one example, the radiation beam is a CPB and the modulator is configured to produce a displacement of a charged particle image beam with respect to the mask by a distance proportional to a compression ratio of an image integrated by the sensor array. In some examples, a charged particle beam source is situated to direct a charged particle beam to a sample so as to produce the charged particle image beam and the mask is positioned along a charged particle beam path between the charged particle beam source and the sample. In other embodiments, a receptacle is situated to retain the sample, wherein the mask is positioned along a charged particle beam path between the receptacle and the sensor array. In further examples, the modulator further comprises a translation stage configured to displace the mask with respect to the charged particle image beam or piezoelectric positioner is coupled to the mask so as to displace the mask along at least one axis. In some examples, a beam deflector configured to scan the charged particle beam image with respect to the mask in a predefined two-dimensional pattern.

Representative methods comprise spatiotemporally modulating a radiation image beam based on a relative displacement of the radiation image beam and a mask and detecting the spatiotemporally modulated radiation image beam with a sensor array to generate a compressed video frame. The compressed video frame is decompressed and stored in a computer readable medium. In some examples, the spatiotemporal modulation of the radiation image beam is produced by moving the mask with respect to the radiation image beam. According to some examples, the mask is translated in a single direction during an integration time of the sensor array.

In other examples, a transmission electron beam microscope comprises a beam source configured to emit an electron beam and a sample receptacle for receiving a sample so as to be irradiated by the electron beam and produce an image beam. A modulator comprising a mask is situated to receive the electron beam from the beam source or the image beam from the sample. The modulator is configured to produce a mask-modulated image beam based on relative displacements of the mask and the sample, the relative displacements typically associated with a predefined periodic scan pattern. An imaging system is coupled to receive the mask-modulated image beam, wherein the imaging system is synchronized with the modulator so that at least a portion of the periodic scan pattern is followed during an integration period of the imaging system. In some examples, the modulator comprises a piezoelectric stage coupled to the mask to produce the relative displacement. In one example, the modulator comprises a beam deflector that moves the electron beam in a rectangular pattern with respect to the mask during the integration period of the imaging system.

Electron beam masks comprise a first plurality of pattern areas associated with a first electron beam attenuation and defined by a first electron beam blocking material and a second plurality of pattern areas associated with a second electron beam transmittance interspersed with the first plurality of pattern areas. In some examples, the first plurality of pattern areas associated with the first electron beam attenuation is defined in a common layer of the first electron beam blocking material and the second plurality of pattern areas associated with the second electron beam transmittance is defined as a plurality of apertures in the common layer. In further examples, the second plurality of pattern areas associated with the second electron beam transmittance is defined as a plurality of thinned areas of the common layer. In still other examples, the second plurality of pattern areas associated with the second electron beam transmittance is defined in a second electron attenuating material. According to some examples, the first plurality of pattern areas associated with a first electron beam attenuation is defined by portions of the first electron beam blocking layer situated on a surface of a substrate. In some cases, the second plurality of pattern areas associated with the second electron beam transmittance is defined by thinned portions of the substrate. In yet other examples, the pattern areas of the second plurality of pattern areas are pseudo-randomly interspersed with the pattern areas associated with first plurality of pattern areas. In typical examples, the first electron beam blocking material is glass, gold, platinum, iridium, osmium, nickel, and copper, tungsten, tantalum, uranium, lead, silver, as well as any other paramagnetic and nonmagnetic material, or any combinations thereof and has a thickness of between 10 µm and 500 µm.

Representative methods comprise selecting a compressive sensing pattern and defining the compressive sensing pattern in an electron beam blocking layer so as to establish pattern areas corresponding to a first electron beam transmittance and a second electron beam transmittance. In some cases, the first electron beam transmittance is greater than the second electron beam transmittance. In one example, the pattern areas associated with one of the first and second electron beam transmittances correspond to apertures defined in the electron beam blocking layer. In other examples, the electron beam blocking layer is secured to a substrate and the electron beam blocking layer is patterned as secured to the substrate. In some embodiments, the substrate is silicon nitride, silicon dioxide or silicon. In additional alternatives, at least one of the pattern areas associated with one of the first and second electron beam transmittances is established in the substrate. In representative examples, the electron blocking material has a thickness corresponding to a standard attenuation at the first pattern areas or an attenuation difference associated with the first and second electron beam transmittances corresponds to a standard attenuation.

Methods of making an electron beam mask comprise exposing a photoresist layer on a substrate so as to define photoresist areas corresponding to a first electron beam transmittance and a second electron beam transmittance, wherein the first electron beam transmittance is greater than the second electron beam transmittance. The exposed photoresist layer is developed so as to remove the photoresist layer at locations on a substrate surface associated with the second electron beam transmittance and expose the substrate surface. An electron beam attenuating material is formed on at least the exposed portions of the substrate surface to produce mask elements associated with at least the second electron beam transmittance. An electron beam mask is formed by separating the deposited material and the substrate. In other embodiments, the electron beam attenuating material is deposited on the developed photoresist layer, wherein the forming the electron beam mask includes removing the attenuating material on the developed photoresist layer by removing the photoresist layer. In some examples, the photoresist areas associated with at least one of the first electron beam transmittance and the second electron beam transmittance are randomly or pseudo-randomly spaced or to satisfy a restricted isometry property associated with compressive sensing reconstruction.

In some examples, the mask areas associated with the first electron beam transmittance cover 40% to 50% of an active mask area and define features having dimensions of between 10 µm and 60 µm, the electron beam attenuating material is glass, gold, platinum, iridium, osmium, nickel, and copper, and combinations thereof. In typical embodiments, the photoresist areas associated with the second electron beam transmittance are rectangular areas having aspect ratios between one and six. In other examples, mask areas associated with the first electron beam transmittance cover 1%, 2%, 5%, 10%, 20%, or 30% of an active mask area. In additional examples, a mask pattern that defines mask elements, is established and compressive sensing reconstruction with the mask pattern is simulated. Based on the simulation, the photoresist areas corresponding to the first electron beam transmittance and the second electron beam transmittance are defined based on the mask pattern.

Electron beam masks comprise a perforated layer of an electron beam attenuating material having a pseudorandom placement of blocking areas interspersed with voids in the perforated layer, wherein the perforated layer has a thickness of less than 100 µm. In some examples, the voids or the blocking areas in the perforated layer satisfy a restricted isometry property. In typical examples, the voids or the blocking areas are rectangular and have lengths and widths that are less than 20 µm. In still other examples, the voids have a pseudorandom placement and the blocking areas have an electron beam transmittance of less than 40%. According to representative embodiments, the blocking areas are rectangular and have aspect ratios between one and four. In other representative examples, the blocking areas are gold having a thickness of between 20 µm and 40 µm or the blocking areas are copper having a thickness of between 70 µm and 90 µm. In further representative embodiments, a frame secured to the perforated layer and the frame and the perforated layer are portions of a common attenuating layer.

Methods of generating a pattern for an electron beam mask comprise initializing pattern areas to have a first attenuation. A plurality of non-overlapping pattern areas are is configured to have a second electron beam attenuation that is different from the first electron beam attenuation, the plurality of non-overlapping pattern areas arranged to exhibit a restricted isometry property associated with compressive sensing reconstruction. The non-overlapping pattern areas are rectangular and are assigned lengths and widths, and have pseudo-random offsets. The pattern area assignments in a computer-readable storage device. In some examples, the first electron beam attenuation is greater than the second electron beam attenuation or the first electron beam attenuation is less than the second electron beam attenuation. According to some examples, the rectangular pattern areas have aspect ratios between one and four and the lengths and widths of the pattern areas are between 5 µm and 100 µm. In still further examples, the pattern areas of each of the plurality of pattern areas having the second CPB attenuation are separated by at least 5 µm and a fraction of the pattern area occupied by the plurality of pattern areas having the second CPB attenuation is between 40% and 50%.

According to some examples, a radiation beam is lens modulated based on a modulation of a characteristic of a lens that directs a sample-modulated radiation beam to a sensor. The lens and sample modulated radiation beam is detected with a sensor so as to produce a detected beam data series, and the detected beam data series is decompressed. In some embodiments, the decompressed detected beam data series is stored in a computer readable medium. In other alternatives, the characteristic of the lens that is modulated is a lens focal length, a lens position along an optical axis, or a lens position transverse to the optical axis. In other cases, the image beam is associated with a sample area and the sensor is a single element sensor.

In other examples, imaging systems comprise a modulator situated to generate a modulated image beam of a sample and a sensor situated to receive and detect the modulated image beam at a diffraction plane. A processor is coupled to the sensor and operable to produce a diffraction image of the sample based on a plurality of detected modulated image beams detected at the diffraction plane. In some examples, the diffraction image is a combined phase and magnitude image. In typical examples, the modulator is coupled to modulate a beam focus, a beam displacement with respect to the sample and/or the sensor, or a beam angle of incidence at the sample or the sensor, or an interference between beams. In other embodiments, the modulator includes at least one mask situated to receive a radiation beam and generate a mask-modulated image beam of the sample and the processor is operable to produce the diffraction image of the sample based on a plurality of detected mask-modulated image beams detected at the diffraction plane. In some cases, the mask comprises a plurality of transmissive and non-transmissive elements having a predetermined width and length, and the modulator is operable to produce a displacement of a radiation image beam with respect to the mask by at least the predetermined width or the predetermined length to produce the plurality of mask-modulated image beams.

In additional examples, methods comprise modulating a radiation image beam to generate at least one modulated image beam and detecting a plurality of modulated image beams with a sensor array at a diffraction plane to obtain a plurality of modulated diffraction images. The images of the plurality of modulated diffraction images are decompressed to obtain a diffraction image of a sample. In some examples, the diffraction image is stored in a computer readable medium and the modulation of the radiation image beam is produced by moving at least one mask with respect to the radiation image beam. In some implementations, the radiation beam is a charged particle beam (CPB) and the modulation of the radiation image beam is applied by moving the radiation image beam with an electrostatic or magnetic beam deflector. In other examples, the radiation image beam is modulated to generate the at least one modulated image beam by modulating a beam focus, beam current, beam position, sample position, or sample tilt. In typical examples, the diffraction image is a combined phase and magnitude image, a phase image, or a magnitude image.

Transmission electron beam microscopes comprise a beam source configured to emit an electron beam and a sample receptacle for receiving a sample so as to be irradiated by the electron beam and produce an image beam. At least one modulator is situated to receive the electron beam from the beam source or the image beam from the sample, and is operable to produce at least one modulated image beam. An imaging system is situated to receive the at least one modulated image beam at a diffraction plane, and produce a magnitude, phase, or combined magnitude and phase diffraction image of the sample.

The foregoing and other features, and advantages of the disclosed technology will become more apparent from the following detailed description, which proceeds with reference to the accompanying figures.

BRIEF DESCRIPTION OF THE DRAWINGS

FIG. 1 illustrates a representative charged particle beam (CPB) imaging system.

FIG. 2 illustrates a representative method of charged particle beam imaging.

FIG. 3B illustrates representative translations of the movable aperture of FIG. 3A.

FIG. 4A-4B illustrates an example controller and an associated timing diagram for controlling a movable aperture.

FIG. 9A illustrates an example method of generating a beam mask for compressive sensing.

FIG. 9B illustrates another example method of generating a beam mask for compressive sensing.

FIGS. 11A-11B illustrate representative mask pattern.

FIG. 12 illustrates assignment of CPB transmittances to mask areas to define a CPB mask.

FIG. 16 illustrates another representative mask pattern.

DETAILED DESCRIPTION

Figure 3A:
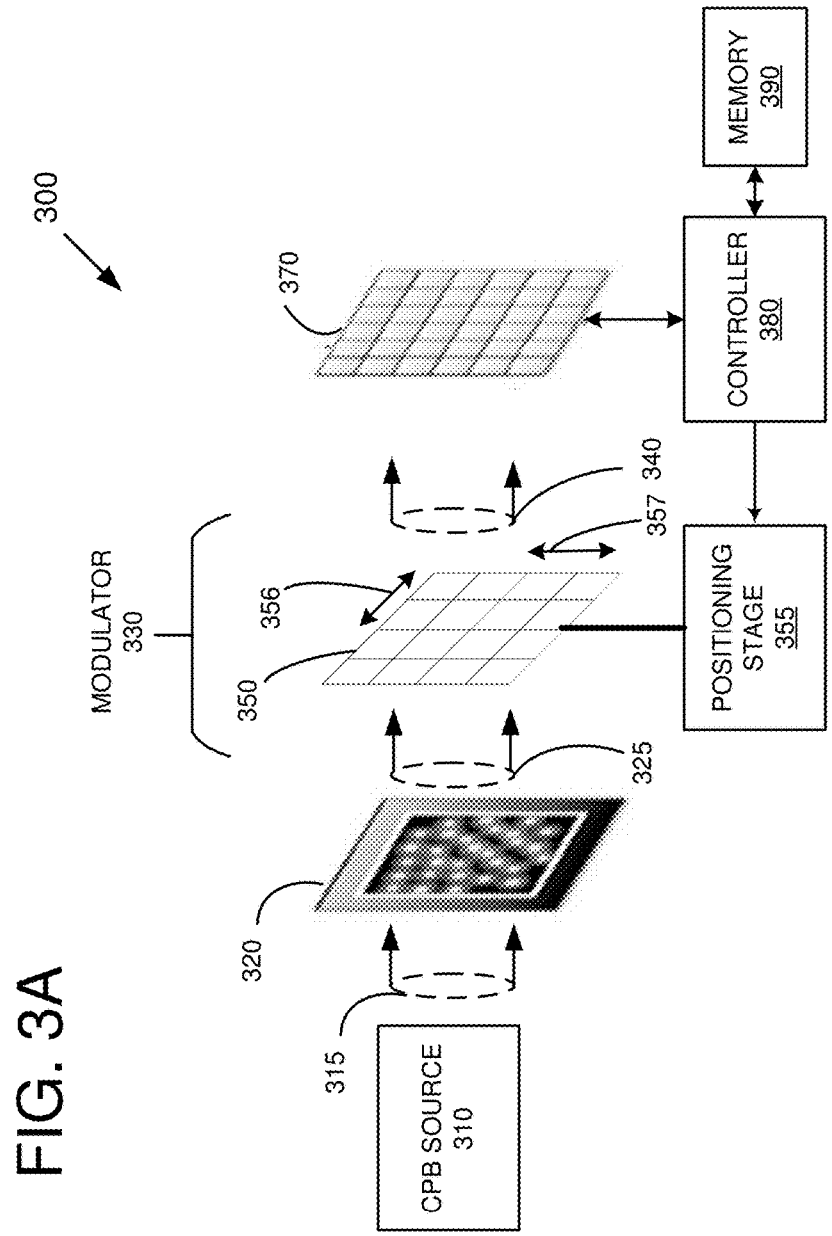
FIG. 3A illustrates a transmission charged particle beam microscope system that includes a moveable aperture.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections. In some cases, examples are described with reference to directions indicated as "above," "below," "upper," "lower," and the like. These terms are used for convenient description, but do not imply any particular spatial orientation.

The disclosed methods and apparatus generally pertain to particle beam-based imaging systems, such as those associated with charged particles such as electrons or positively or negatively charged ions. As used herein, "radiation" or "radiation beam" refers to charged particle beams such as electron or ion beams, neutral particle beams such as neutron beams, electromagnetic radiation beams at wavelengths less than 400 nm such as extreme ultraviolet, soft X-rays, hard X-rays, and gamma ray wavelengths, or greater than infrared wavelengths such as far-infrared, microwave, millimeter wave, or longer wavelengths. Some radiation beams can be referred to as particle beams (e.g., ions, neutrons, electrons) while others can be referred to as high-energy electromagnetic radiation beams. Propagating electromagnetic radiation at wavelengths between 400 nm and 700 nm is referred a visible beam. Visible and infra-red beams can also be used. As used herein, the term "image" or "image beam" can refer to a spatial variation in a particle beam amplitude or phase, typically produced in a particle beam by a specimen under investigation. For example, in transmission electron microscopy (TEM), an image beam is produced by directing an electron beam to a specimen so that a transmitted beam has a spatially varying amplitude or phase associated with the specimen. In some examples, a charged particle beam (CPB) such as an electron beam is scanned across a specimen and spatial variations in the scanned beam correspond an image beam. The term "image" is also used to refer to a visible image such as obtained by displaying a CPB image on a display device or a fluorescent screen. In addition, the term image can also refer to a detected image corresponding to numerical values associated with spatial variations in CPB beam intensity or phase as a function of position. For example, image beams can be detected to produce an array of CPB intensity values $I(x,y)$ that are a function of transverse coordinates $(x, y)$. Such detected images can be recorded and stored in a computer-readable medium or transmitted as arrays, or in other image formats such as JPEG, TIFF, or other compressed or uncompressed formats. A sequence of beam images obtained at regular or irregular time intervals can be used to produce a corresponding sequence of recorded or stored images; such sequences are referred to as videos, video signals, or video sequences. A single image of a video sequence can also be referred to as a video frame. Images having modulations associated with compressive sensing (CS) can be referred to as compressed images or compressed video frames. In the disclosed examples, array detectors such as CCDs or DDCs are typically used to detect particle beam images. Such detectors generally integrate received particle beam intensity during a selectable frame duration. As used herein, an integration time is a time period in which a sensor array accumulates an image signal before capture and readout.

Because acquisition of image and video data is a common application of the disclosed methods and apparatus, the disclosed examples are frequently described with reference to video or image capture, but sample diffraction patterns can also be acquired. Using the disclosed masks to acquire multiple diffraction image can permit phase retrieval.

In typical examples, particle beams or other radiation beams are modulated by transmission, reflection, scattering, or other interactions with one or more beam masks. Such a beam mask is generally divided into a plurality of mask elements arranged in an array, each of which can be arranged to produce a selected beam attenuation or phase change. Typically, the mask elements are arranged as a first set of mask elements and a second set of mask elements, wherein the first and second sets of mask elements produce first and second attenuations and/or phase changes or other modulations, respectively, wherein the first and second attenuations and/or phase changes are different. Mask elements can have varying dimensions and aspect ratios. For convenient description, mask areas are referred as transmissive or non-transmissive. As used herein, non-transmissive refers to transmittances of less than 25%, 10%, 5%, 1%, or 0.1%; transmissive refers to transmittances greater than 5%, 10%, 25%, or 50%. Typically values are selected so that a ratio of transmittances is at least 5:1, 10:1, 20:1, or 100:1. As used herein, a reference or "standard" attenuation for a radiation beam at a selected wavelength or of a selected particle type is an attenuation that corresponds to electron beam blocking provided by a 25 µm thickness of gold.

In some cases, beam masks having first and second pattern areas with an attenuation difference that is about the same as the reference attenuation are suitable. A particle beam that has been acted upon by such as mask can be referred to as a mask-modulated particle beam. Modulation for compressive sensing (CS) can be applied to particle beams with masks or in other ways, and such particle beams generally referred to as modulated or encoded beams. Beam encoding can be applied by directing a particle beam to a mask and then to a specimen, or directing the particle to the specimen and then to a mask. For some types of radiation, spatial light modulators (SLMs) are available that permit modeling radiation beams by varying characteristics of the SLM. Liquid crystal based SLMs can be used for some wavelength ranges.

The term "signal" as used herein generally refers to a time-varying particle beam intensity or phase, or a time-varying electrical current or voltage. Image signals are signals associated with images and video sequences, and are typically processed as a sequence of electrical images represented as image currents or voltages.

In the disclosed examples, beam masks are situated at particular locations for convenient illustration. For examples in which a beam mask is situated at a specimen or at a specimen image plane, such a beam mask can generally be situated at other locations that are optically conjugate to the specimen. Similarly, in examples in which a mask or sensor is situated at a transform plane, such a mask or sensor can be situated at other conjugate locations. Conjugate planes can be provided with one or more beam lenses that image such planes onto each other via one or more intermediate planes.

In the disclosed examples, binary masks are used in which some mask pattern areas apply a first modulation and other mask pattern areas apply a second modulation. These modulations are conveniently described as amplitude modulations but other types of modulations can be applied. In addition, masks having two, three, or more sets of pattern areas that apply respective modulations can be used. For example, three sets of pattern areas can apply first, second, and third modulations respectively. CS-based systems can use such modulations as well. Such masks can use different thicknesses or types of material or combinations thereof to provide such different modulations. These differing modulations can be between 0% and 100% for masks that provide amplitude modulation. However, for convenient illustration, the examples are described with reference to binary masks.

Beam modulation can also be provided by directing one or more optical beams (such laser beams at the same or different wavelengths) so as to scatter electrons from an electron beam so that the scattered electrons do not reach a sensor or sensor array. In still other examples, optical elements such as lenses (for particle beams or electromagnetic radiation) can provide beam modulation by varying lens focal length or lens position along or transverse to an imaging system optical axis, beam angle of incidence, or other lens characteristics. Beam modulation can also be provided by varying beam phase or coherence with an applied electromagnetic field. In addition, a beam source can be modulated. In some examples, an array of emitters with independently modulatable emitters can be used to generate a spatially modulated beam.

Introduction

Compression of a signal can reduce an amount of data needed to represent a video, provide increased temporal or spatial resolution in image or video data, permit reduced data acquisition times while maintaining signal to noise ratio, or provide other signal analysis and acquisition features, typically based on the use of signal sparsity and incoherence. Compression can occur after videos, images, diffraction patterns, or other data have been captured and stored. However, as described herein, compression can occur during the acquisition of a video by using compressive sensing (CS). Compressive sensing combines sensing and compression in one operation to increase the temporal resolution of any detector (both CCDs and DDCs). Using CS, fewer total measurements may be required, which, when applied to particle beam video capture, can potentially increase the acquisition speed and reduce required particle beam dose.

Using the approaches described herein, an effective frame rate of a camera can be increased by modulating an image prior to acquisition by an imaging sensor. As one example, modulation is applied by directing a particle beam received from a sample (i.e., an image beam) to a particle beam mask and then to an image sensor. The mask can be moved at a fixed or variable rate so that a sequence of images associated with different modulations or encodings by the mask are acquired and combined in a single frame. Alternatively, a modulation can be applied to a particle beam with a stationary mask, and the particle beam scanned over the mask.

Upon acquisition of a sequence of images, the images can be decompressed as described below. In one example, a sequence of encoded TEM images is acquired, and a reconstructed (i.e., decompressed) image sequence can be used to estimate an electron beam dose associate with an onset of beam damage.

Using CS, an image signal can be compressed at the time of measurement and accurately recovered at a later time with suitable decompression using hardware and/or software. In imaging applications, the compression can be applied spatially to reduce the number of pixels that need to be measured. This can lead to an increase in sensing speed, a decrease in the amount of image data needed, and dose reduction, which can be especially helpful in electron microscopy. In video applications, the time dimension can be compressed. By compressing the sensed data in time, the total frame rate of a camera system can be increased by a factor associated with a compression ratio by integrating a sequence of coded images into a single frame.

In some respects, the CS methods and apparatus disclosed herein are counter-intuitive to traditional signal acquisition techniques which sample and then compress the sampled data. Traditional approaches are motivated by the Nyquist-Shannon sampling theorem, which states that in order to accurately reconstruct a signal, it must be sampled at a frequency at least twice the highest frequency present in the sample. For example, the sampling theorem states that for a band-limited signal that is a sum of three sine waves with different frequencies (such as 1 Hz, 9 Hz, and 64 Hz) and amplitudes, a sampling frequency of at least 128 Hz is required to reconstruct the signal. Yet, in the frequency domain, three samples are sufficient; the signal is said to be 3-sparse under the Fourier basis. In CS, non-adaptive sensing measures signals in a basis that tends to make the signal as sparse as possible so that the number of measurements can be reduced below the Nyquist rate. Different bases can be selected for CS approaches, such as Fourier modes or wavelets, but it is also possible to discover the basis from the measurements.

CS can be implemented in a variety of ways. In one example, CS can be applied to video signals by using a coding scheme called pixel-wise flutter-shutter which selectively blocks one or more pixels on an image sensor during an integration time. (In the following, boldface type is used to represent matrices.) A value $Y_{ij}$ associated with a single pixel of a measured image can be represented as:

$$Y_{ij} = [A_{ij1} \ A_{ij2} \ \cdots \ A_{ijL}] \begin{bmatrix} X_{ij1} \\ X_{ij2} \\ \vdots \\ X_{ijL} \end{bmatrix},$$

wherein $A_{ijf}$ are binary indicators of whether a mask element blocks a pixel ij in a frame f, X is an image, and L is a number of frames (images). This representation can be simplified as $Y_{ij} = \Phi_{ij} x_{ij}$, wherein $$x_{ij} = \begin{bmatrix} X_{ij1} \\ X_{ij2} \\ \vdots \\ X_{ijL} \end{bmatrix}$$

and $\Phi_{ij}=[A_{ij1}\ A_{ij2}\ \ldots\ A_{ijL}]$. A complete representation of mask modulation can be provided as a block diagonal matrix $\Phi$ which is given by:

$$\Phi = \text{diag}(\Phi_{11}, \Phi_{12}, \ldots, \Phi_{N_x N_y}).$$

wherein the image size is $N_x \times N_y$ pixels. In some examples, images are divided into patches so the image data $x_i$ in a mixture of factor analyzers (MFA) model is of size based on the patch size. For patch size of 4, the image data points is of size 4×4×L.

Compressed measurements for CS-MFA can be obtained by spatially and/or temporally modulating an image beam with a coded aperture mask. For example, an image beam can be directed to a coded aperture mask that applies a modulation to the image beam at a rate faster than a rate at which an image sensor produces images. Such a modulation provides acquired images based on multiple mask encodings. Modulation can be applied in various ways. As one example, a mask is translated or otherwise subjected to a time-varying displacement using one or more translation stages, such as piezoelectric stages. Such stages can be moved along one or more axes based on applied stage drive signal. If a triangular wave drive signal having up and down ramp portions is used, sets of encoded images can be obtained during the up ramp and the down ramp; stage motion along orthogonal axes can be used. Different positions of the mask with respect to the image establish different image encodings, and different masks are not required to produce different encodings. Since a time-varying position of the mask can be obtained based on the applied stage drive signal, image encoding as a function of time is known. A compression ratio of a modulated image can be determined based on a range of motion of the mask. Effectively, moving n feature sizes or pixels of the mask can provide a compression ratio of n and n differently encoded images are combined in single frame captured by an image sensor if a suitable image integration time is selected. To produce a CS modulated image, these n different images are to be integrated into a single frame.

As described herein, particle beam imaging systems using CS include a mask such as a self-supported, single-piece mask that includes a plurality of mask regions that apply different modulations. For example, the mask regions can selectively apply different amplitude or phase modulations. In convenient examples, such a mask for particle beam imaging using transmission includes mask regions that are substantially non-transmissive and mask regions that are substantially transmissive. Such a mask can be formed by patterning transmissive and non-transmissive regions on a substrate, and an array of patterned regions removed from the substrate. For example, non-transmissive regions can be formed using electroplating of materials that are non-magnetic and have a high blocking power for charged particles, such materials having large atomic numbers. The transmissive regions can be voids or holes in the non-transmissive regions. Generally, any patterned arrangement of regions with differing attenuations can be used for transmission particle beam imaging.

Example 1

Charged Particle Beam Imaging System

FIG. 1 illustrates a representative charged particle beam (CPB) imaging system 100. It should be noted that FIG. 1 and the other Figures herein are provided for illustrative purposes and are not to proportion or to scale unless specifically noted as being to scale. The CPB imaging system 100 include a CPB column 105 for forming and transforming a charged particle beam that is directed toward a sensor array 170. The column 105 includes various CPB optical components, such as one or more of beam sources, lenses, apertures, deflection systems, alignment coils, blanking plates, scintillators, and stigmators. As shown in FIG. 1, the column 105 includes a beam source 110 that directs a beam toward sample that is retained by a sample receptacle 120. A modulator 130 is situated between the sample and the sensor array 170 so as to apply a modulation to a transmitted CPB image beam. The column 105 is generally coupled to a vacuum pump and one or more power supplies for operation at suitable pressures and to control and adjust CPB optical elements, but for convenient illustration, these are not shown in FIG. 1. The CPB from the beam source 110 is transformed as it passes through and interacts with the various components of the column 105. For example, an image beam produced by transmission of the CPB through the sample has a spatially varying beam intensity or phase based on spatially varying CPB absorption, reflection, deflection, and/or transmission in a sample.

In one embodiment, the CPB imaging system 100 is a transmission electron microscope (TEM) system and the beam source 110 generates an electron beam. The beam source 110 can be oriented to irradiate an area of a sample placed in the sample receptacle 120. Alternatively, a scanned beam can be used such in a scanning TEM in which a small area beam is scanned across the sample, typically in a raster pattern.

The sample receptacle 120 can be positioned along a charged particle beam path between the beam source 110 and the modulator 130. The sample receptacle 120 can be used to hold a sample and can include calibration controls to bring the region of interest into the path of the charged particle beam. For example, the calibration controls can include stepper motors, piezoelectric positioning stages, screw gearing, or other mechanical and/or electrical devices suitable for adjusting a translation and/or rotation of the sample within the sample receptacle 120. The sample receptacle 120 can include an airlock for enabling a sample that is not under a vacuum to intersect with the charged particle beam. For example, the sample can be placed within a dedicated gas cell holder that can be inserted into the sample receptacle 120. The cell holder can also include a heater so that the sample can be tested under a pressure and temperature that is different from the pressure and temperature of the column 105. The cell holder can include a standard size grid to place the sample or the sample can be self-supporting. Grid materials can be copper, molybdenum, gold, or platinum, for example.

The modulator 130 is situated to receive the image beam. In one example, the modulator 130 includes a mask 150 that includes a pattern of mask regions that are non-transmissive (or substantially attenuating) and transmissive (substantially non-attenuating) that receives the image beam. The transmissive and non-transmissive regions of the mask can have a predetermined width and length. Each of the transmissive and non-transmissive modulation regions can have a different predetermined width and length. The width and length can be based on a variety of factors, such as a resolution of a photoresist used to create the mask 150, a pixel size of the sensor array 170, properties of the material forming the non-transmissive areas, and other factors.

The non-transmissive areas can be constructed of a material that partially or completely blocks charged particles for a given charged particle energy. The blocking can be caused by absorption or by backscattering, for example. As a specific example, non-transmissive areas can block over 90% or 95% of 300 kV electrons that are incident on the non-transmissive areas. In one embodiment, an active area of the mask 150 to which a CPB is directed is self-supported using only the structure of the non-transmissive areas. In other words, the active area of the mask 150 can include transmissive holes or voids and non-transmissive areas that also from a support structure. A non-active mask area is an area that is not intended for CPB beam modulation but can be provided as a support for the active area. In some cases the support is a perimeter region that forms a frame for the active mask area.

The modulator 130 can be configured to produce a relative translation or displacement of an image beam with respect to the aperture mask 150. For example, the relative translation can cause an image beam modulation at a rate faster than an integration time or frame rate of the sensor array 170. In particular, the modulator 130 can be configured to produce a displacement of the image beam with respect to the aperture mask 150 by at least the predetermined width or the predetermined length of one or more of the transmissive and non-transmissive modulation regions.

As one example, the relative translation or displacement can be caused by a stationary beam and a moving aperture. In particular, the modulator 130 can include a translation or positioning stage 155 that can is coupled to move the mask 150 with respect to the CPB. Alternatively, beam deflector 140 can deflect the image beam with respect to the mask 150 and a beam deflector 160 can return the mask-modulated image beam to substantially its original propagation direction so as to be incident to the sensor array 170 with little or no displacement due to this beam deflection.

Typically, the stage 155 (and/or beam deflectors 140, 160) and the sensor array are coupled to a processor 180 for control and data transfer. The processor can also include one or more computer-readable storage devices that have processor-executable instructions for decompressing compressed images to produce video sequences. Compressed and uncompressed image and video data (and control instructions and data) can be stored in storage device 190.

Example 2

Charged Particle Beam CS Methods

FIG. 2 illustrates an example method 200 for CPB imaging using CS. Such a method can be implemented using various CPB imaging systems such as, for example, the imaging system shown in FIG. 1. At 210, a charged particle (CP) image beam is formed by, for example, exposing a sample to a CPB such as an electron or ion beam. As a specific example, the CPB beam can be transmitted through the sample to form the CP image beam. Variations in intensity or phase in the CP image beam are associated with differences in structure and/or composition of the sample. At 220, the image beam can be spatiotemporally modulated using displacement of the CP image beam with respect to a mask. The CP image beam can be modulated in a variety of ways including by moving a mask with respect to the CP image beam and/or by moving or scanning the CP image beam relative to the aperture. As one example, the beam is modulated by mechanically moving the mask using a translation or positioning stage.

At 230, the modulated image beam is detected to capture a compressed video frame using a sensor array that detects a varying intensity of the modulated beam. The modulated image beam can cover all of or a portion of a sensor array area to convert a time-varying intensity of the modulated image beam into a series of compressed video frames. For example, the modulated beam can be directly sensed by CMOS sensors of a DDC or indirectly sensed using a scintillator and a CCD array. Each compressed video frame can be collected during a sensor integration or exposure time.

At 240, the detected compressed video frame can be stored in a computer readable medium. The compressed video frame can be stored in association with metadata about the video frame such as a timestamp, sequence number, or other information about relationships to other video frames, information about the experimental setup, and so forth. In some examples, a timestamp can be used to determine mask position (and hence, mask modulation) for decoding. The computer readable medium can include one or more of volatile memory, non-volatile memory, removable medium, non-removable medium, and/or any other medium which can be used to store information in a non-transitory way and which can be accessed by a processor of the imaging system.

At 250, an uncompressed video frame is reconstructed from the compressed video frame using compressive sensing reconstruction. For example, a processor can execute a software reconstruction module that uses one or more compressed video frames stored on the computer readable memory to create the uncompressed frame. At 260, the uncompressed frame is stored in a computer readable medium.

An integration or frame-grab of the modulated image beam with a sensor array can be synchronized with the movement of the positioning stage. The encoded mask can be moved in a predetermined pattern in one or more directions. However, the mechanical response of the positioning stage may be more controllable when the stage moves in a linear direction along a single axis. The amount and velocity of movement caused by the positioning stage can be controlled based on various factors, such as a maximum range of the positioning stage (e.g., 500 μm), and/or a desired rate of travel of a feature of the aperture relative to the sensor array. For example, increasing the rate of travel may increase an amount of compression in the modulated beam.

As noted above, in another example, the image beam can be modulated by scanning or deflecting the beam (such as by using electron optics) with respect to the encoding aperture. On the one hand, moving the image beam may enable a wider range of movement than moving the mask because the electronics can be more responsive with fewer or no hysteresis effects. For example, charged beam or electron optics can be used to move the image beam in more complicated patterns, such as along multiple axes. On the other hand, moving the image beam may cause a different pixel mixing at the sensor array compared to only moving the aperture. For example, moving the aperture may not cause the image to move relative to the sensor array. However, moving the image beam can cause the image to move or be displaced relative to the sensor array. Thus, the same pixel of the sensor array can detect different portions of the image as the image is moved. A reconstruction algorithm can potentially account for both the displacement of the image and the modulation of the beam. Alternatively, the beam can be deflected both before and after the aperture so that the image is incident on the sensor without being displaced. It should be noted that moving a sensor array with respect to a mask can have a similar effect as moving the mask with respect to the sensor array. However, the sensor array may have more mass and more connections to other components and so moving the aperture mask may be preferable to moving the sensor array. For purposes of illustration, the examples are described with reference to a stationary sensor array, but are readily adapted to a movable sensor array or a combination of mask and sensor array movement. In addition, in the examples, a mask is typically situated downstream of a sample, but can be situated prior to the sample as well.

Example 3

Charged Particle Beam Microscopy System

A representative CPB microscopy system 300 using a stationary beam and a moving aperture is illustrated in FIG. 3. A CPB source 310 directs a CPB 315 to a specimen 320 so as to produce an image beam 325. A positioning stage 355 is coupled to a mask 350 that is scanned with respect to the image beam 325 to produce a mask-modulated image beam 340. A sensor array 370 receives the mask-modulated image beam 340 and integrates for a time duration established by a controller 380, or otherwise determined. Detected images are stored in a memory 390. For continuous detection of the modulated image beam, an integration time can be less than or equal to a frame time (a reciprocal of the frame rate). For example, one image can be collected while a previous captured image is scanned out of the sensor array 370.

The microscopy system 300 can include sensor arrays of various sizes and resolutions. For example the sensor array 370 can have an array 512×512, 1024×1024, 2048×2048, 3K×4K, 5K×4K, pixels, or other numbers of pixels. Individual sensor elements of a sensor array can range in size from 10 µm on a side to 2.5 µm on a side, for example. As described further below, an element or feature size defined on the mask 350 can be selected to be proportional to the size of individual sensor elements of a sensor array. In some examples, one or more CPB optical elements are controlled to magnify or demagnify a CPB image based on mask element dimensions. For example, mask element dimensions can be multiples of individual sensor element dimensions with or without magnification or demagnification.

The frames or images collected by the sensor array 370 can be stored in the storage device 390 that can include volatile memory (e.g., registers, cache, RAM), non-volatile memory (e.g., ROM, EEPROM, flash memory, etc.), or some combination of the two, accessible by the sensor array 370 and the processor 380. The storage device 390 can include removable or non-removable components, and include magnetic disks, magnetic tapes or cassettes, CD-ROMs, DVDs, or any other medium which can be used to store information in a non-transitory way and which can be accessed within the microscopy system 300. In addition to storing the images collected by the sensor array 370, the storage device 390 can also include software implementing one or more innovations described herein, in the form of computer-executable instructions suitable for execution by the processor 380. For example, the processor 380 can execute software modules for accessing the compressed image data collected by the sensor array 370 and reconstructing uncompressed images using a compressive sensing reconstruction algorithm. The reconstructing uncompressed images can be stored in the storage device 390. As another example, the processor 380 can execute software modules for controlling the stage 355 and/or other components of the microscopy system 300. Typically the mask 350 is displaced along two orthogonal directions 356, 357.

The mask 350 applies a spatial encoding to the image beam 325 based on an arrangement of transmissive and non-transmissive areas of the mask 350. The non-transmissive areas of the mask 350 can occlude more of the image beam 325 than the transmissive areas of the mask 350. As one example, the non-transmissive areas of the mask 350 can occlude greater than 90% of the image beam 325 and the transmissive areas of the mask 350 can occlude less than 10% of the image beam 325. As the mask 350 is displaced by the stage 355, a different spatial encoding is applied to the image beam 325 based on the position of the mask 350. The image beam 325 is modulated so that beam modulation varies during an integration time associated with image or frame capture by the image sensor 370. It should be noted that the mask 350 generally is moved continuously during an integration time (and not discretely). FIG. 3B illustrates three different displacements of a mask 350 that are associated with scan times T0-T3.

The mask 350 can be moved in a predefined periodic pattern so that the image sensor 370 can capture multiple video frames. The image sensor 370 is synchronized with the modulator 330 by the controller 380 so that the relative displacement associated with a predefined periodic scan pattern is followed during a sensor integration period. For example, the sensor array 370 can be synchronized with the modulator 330 so that a first video frame (integrating multiple encodings) is captured by the image sensor 370 as the mask 350 is moved in a first direction at a first speed, and a second video frame is captured by the image sensor 370 when the mask 350 is moved in a direction opposite of the first direction at the first speed. The controller 380 can be used for synchronization including signaling the positioning stage 355 and triggering the image sensor 370.

Example 4

Image Acquisition and System Control

Figure 4B:
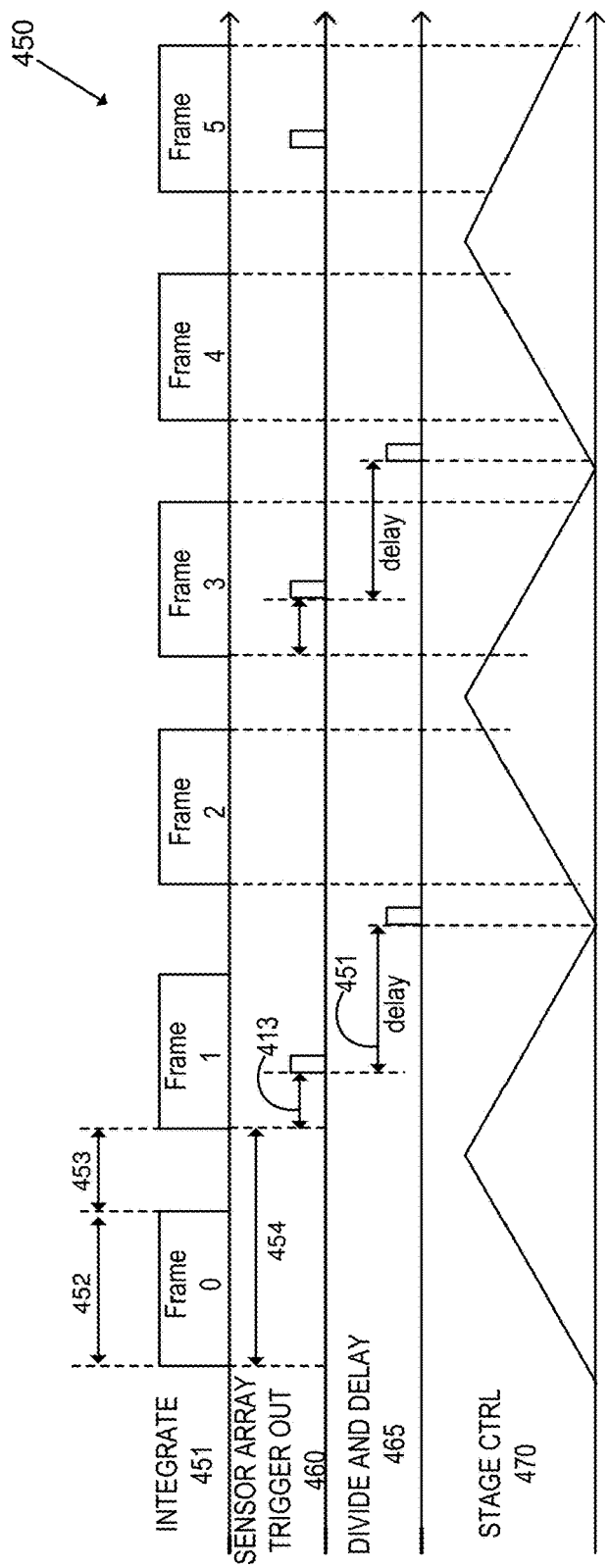

FIG. 4A illustrates an example controller 400 and FIG. 4B illustrates a representative timing diagram 450 for controlling mask displacement. The controller 400 includes a computer 402 such as a desktop, laptop, tablet, handheld or other computer that is coupled to one or more displacement stages 408 so as control or receive a mask position. The computer 402 includes a sensor controller 410 such as a CCD controller that is coupled to a sensor array 412. The computer 402 initiates image acquisition by the sensor array 412 and receives, stores, and processes image data received from the sensor array 412. The sensor array 412 is coupled to a divide/delay circuit 414 so as to produce a control signal to initiate and terminate stage motion. The divide/delay circuit 414 is coupled to a waveform generator 416 that can deliver a stage drive signal to the displacement stages 408. In other examples, the computer 402 initiates image acquisition and generates stage control signals which in some cases, require additional processing such as amplification. The computer 402 can execute computer-executable instructions to communicate with and initiate and terminate actions of the sensor array 412 and the stage controller 406.

Referring to FIG. 4B, in some examples, image acquisition and integration by the sensor array 412 is provided by coupling an integrate signal 451 to the sensor array 412. Typically, the integrate signal 451 is asserted during an integration time period 452 when a modulated beam is being detected by the sensor array 412. The integrate signal 451 is typically de-asserted for a time period 453 between integration time periods. A frame period 454 is a time period between capture of consecutive compressed video frames by the sensor array 412. A frame rate is the reciprocal of the frame period 454.

The sensor array 412 can provide a trigger out signal 460 that occurs in response to a beginning of an integration time period. For example, the trigger out signal 460 can be a short pulse that occurs in response to a beginning of an integration time period. The trigger out signal 460 may be delayed by a delay time 413 from the beginning of the integration time period due to delays caused by buffer circuits and other electronic components. The trigger out signal 460 can be further delayed using the divide/delay circuit 414 that provides a divide and delay signal 465 to the waveform generator 416. A delay is established so that sensor integration times are suitably aligned with a stage control signal 470 so that movement of the aperture mask has a desired set of properties. For example, the delay 451 can be tuned so that a mask is moving at a relatively constant speed during a sensor integration period. The waveform generator 416 can generate the stage control signal 470 as a triangle wave at a frequency of the divide and delay signal 465. The stage control signal 470 can drive the stage(s) 408 directly or through the stage controller 406. For example, the stage(s) 408 can be piezoelectric positioners with multiple piezo stages. One piezo stage can control the coding motion and two remaining stages can be incorporated for aligning the aperture mask to intersect the image beam. The stage control signal 470 can cause one of the piezo stages to move the mask back and forth periodically along a linear direction. For example, the mask can be moved in one direction when the stage control signal 470 has a positive slope and in the opposite direction when the stage control signal 470 has a negative slope. The mask may move at a more constant velocity when the stage control signal 470 is farther from a trough and peak of the triangle wave. For example, the mask can decelerate, reverse direction, and then accelerate at each of the troughs and peaks of the triangle wave. Thus, the integrate signal 451 can be aligned with the stage control signal 470 such that image integration by the sensor array 412 is enabled during time periods in which the mask is moving at a more constant velocity (e.g., away from the troughs and peaks).

Example 5

Image Encoding with Scanned Beams

Figure 5:
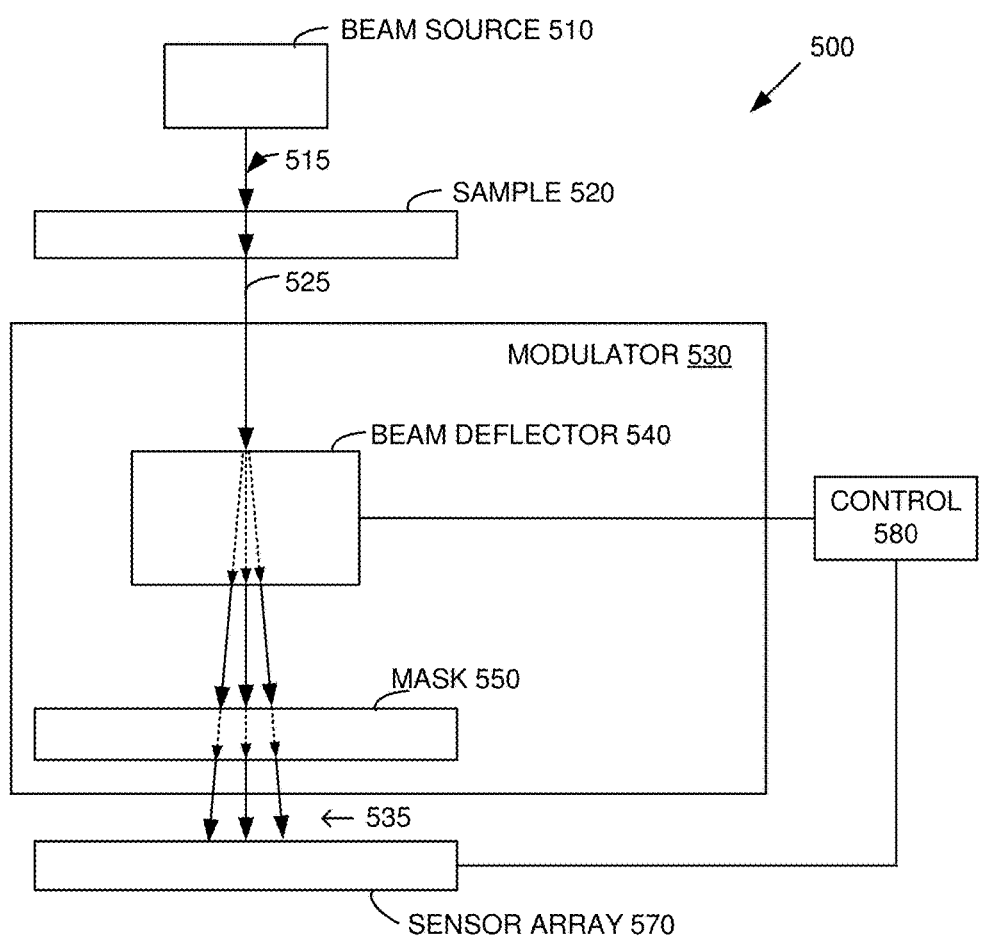
FIGS. 5-6 illustrate CPB imaging systems that include beam deflectors for CPBs.

Additionally or alternatively, the relative translation or displacement of the charged particle beam image with respect to a mask can be obtained by moving or scanning the image beam. Referring to FIG. 5, a beam source 510 directs a particle beam 515 to a sample 520 to produce an image beam 525 that is directed to a modulator 530. The modulator 530 includes a beam deflector 540 and a mask 550. A deflection controller 580 is coupled to the beam deflector 540 so as to sweep, scan, or otherwise direct the image beam 525 across the mask 550. As a result, a mask-modulated image beam 535 is directed to a sensor array 570. Typically, the beam deflector 540 includes one or more deflection coils or electrostatic deflectors that are controlled to scan the image beam in a predetermined pattern across the mask 550.

Modulation of an image beam as shown in FIG. 5 produces mask-modulated image beam similar to those produced with mask displacements. However, moving an image beam with respect to a mask can be simpler as mechanical stages are not needed. Of course, mechanical scanning and beam scanning can be used together, if preferred. Scan patterns can be periodic one dimensional or two dimensional patterns.

The scanning of the image beam 525 can be synchronized with image integration by the sensor array 570 using the controller 580. For example, a period of the beam scan pattern can be synchronized with an integration period of the sensor array 570. As discussed above, the image beam 525 is modulated at a rate faster than the sensor array frame rate so that multiple mask-modulated images are acquired during a sensor array integration time. In the example of FIG. 5, each modulated image can be scanned so as to be incident to the sensor array at a location different than without beam scanning. Thus, typically, detected image data associated with multiple sensor array elements is combined to produce a compressed image or compressed video. By contrast, with mechanical scanning, each image area with an associated modulation is directed to a fixed sensor area. Thus, image reconstruction with beam scanning can require preprocessing to obtain compressed images prior to reconstruction as done with mask-displacement based methods.

Example 5

Image Acquisition with Beam Scanning and Restoration

Figure 6:
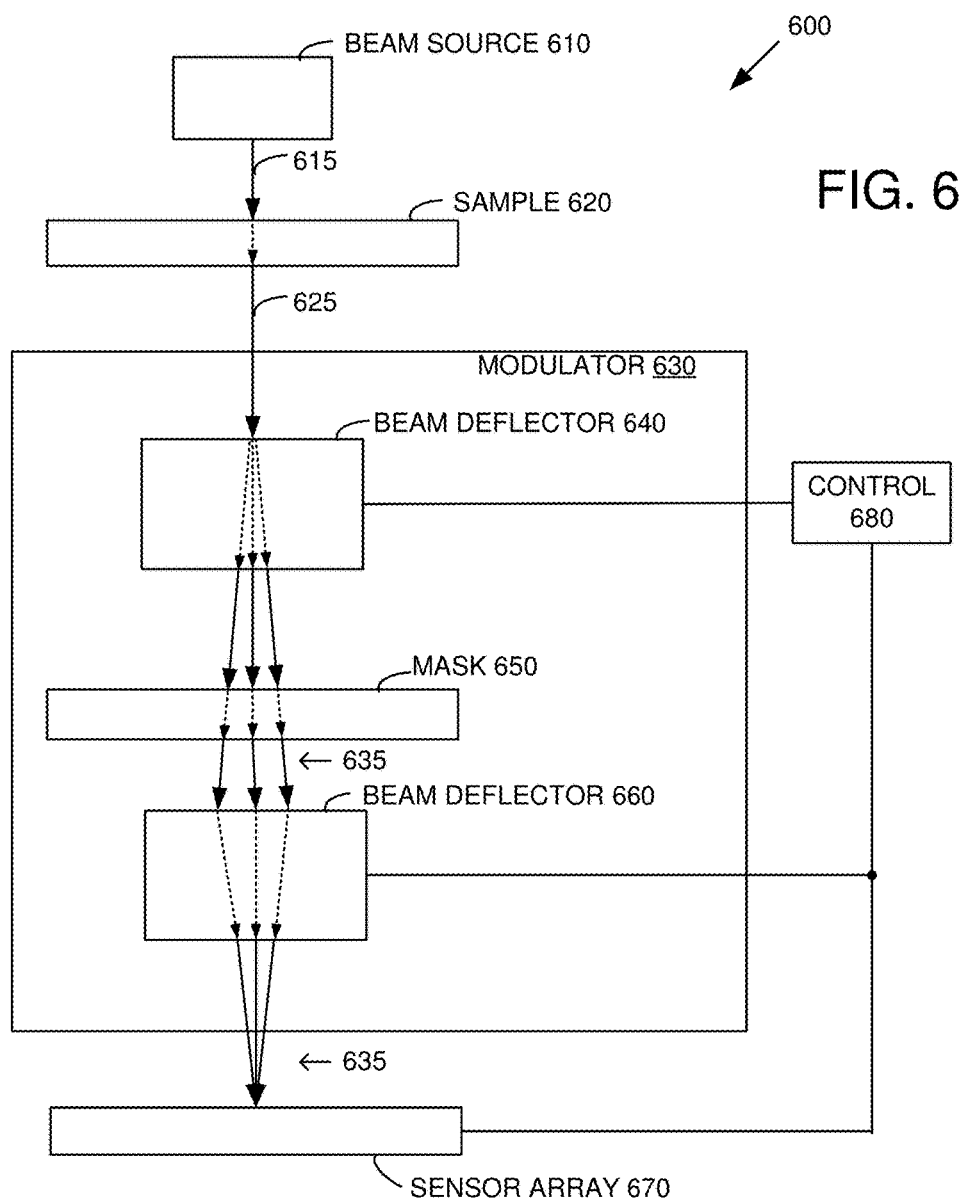

Image displacement at a sensor array in beam scanning can be avoided. Referring to FIG. 6, a CPB imaging system 600 includes a beam source 610 that directs a CPB 615 through a sample 620 to produce an image beam 625 that is directed to a modulator 630. The modulator 630 includes a first beam deflector 640 situated to deflect the image beam with respect to a mask 650 to produce a mask-modulated image beam 635. A second beam deflector 660 is situated to apply a deflection to the mask-modulated beam 635 so as to compensate beam deflection supplied by the first beam deflector 640. As a result, the mask modulated beam 635 is received at a sensor array 670 with suitable time-varying modulation by the mask 650 but with minimal time varying beam displacement. Thus, sensor elements of the sensor array 670 receive modulated beam portions associated with a fixed sample area. Modulation by the mask 650 is selected by deflection controller 680 that is coupled to the first beam deflector 640 and the second beam deflector 660. The controller 680 can synchronize the first beam deflectors 640, the second beam deflector 660, and image acquisition by the sensor array 670.

Example 6

Mask Scanning

FIGS. 7A-7F illustrate representative displacements of a mask 700 with respect to a sensor array 705 having representative sensor elements S(I,J), wherein I, J are integers that denote rows and columns. For convenience, the sensor array 705 includes eight rows (numbered 0-7) and eight columns (number 0-7), and a sensor element situated in an upper left hand corner is identified as sensor element S(0,0). The mask 700 is defined by an array of mask elements that selectively attenuate or otherwise modulate a CPB. For convenience, a modulation associated with a mask element (I,J) is referred to as M(I,J), wherein I, J are integers that denote rows and columns of the mask. In the example of FIG. 7, the mask 700 includes ten rows and ten columns, and an upper leftmost mask element provides a modulation M(0,0).

Figure 7A:
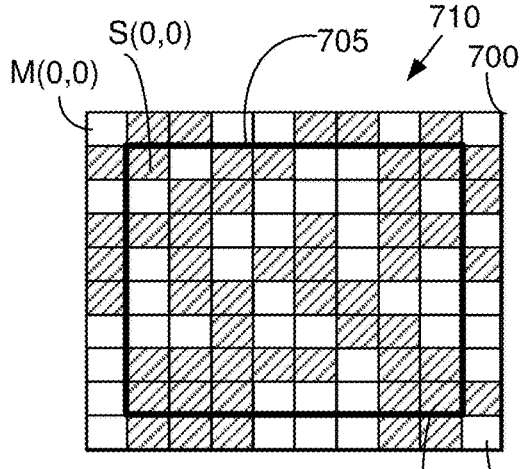
FIGS. 7A-7D illustrate representative displacements of a sensor array and CPB mask.
Figure 7B:
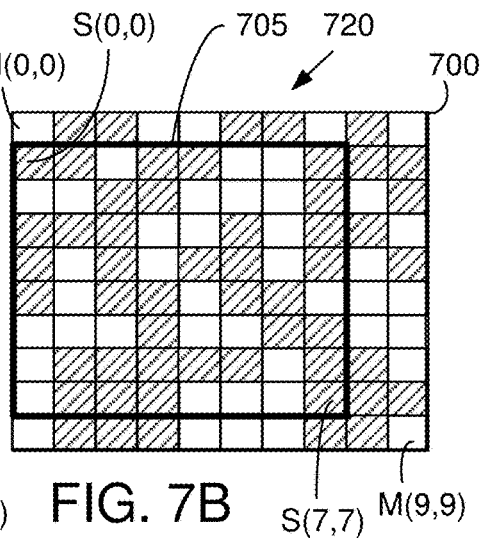
Figure 7D:
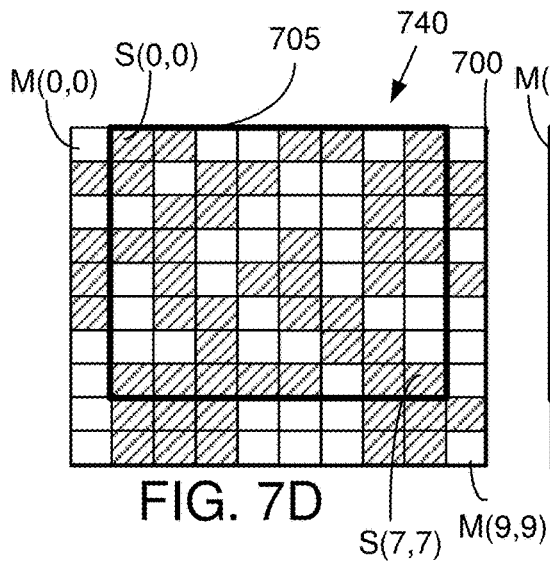
Figure 7C:
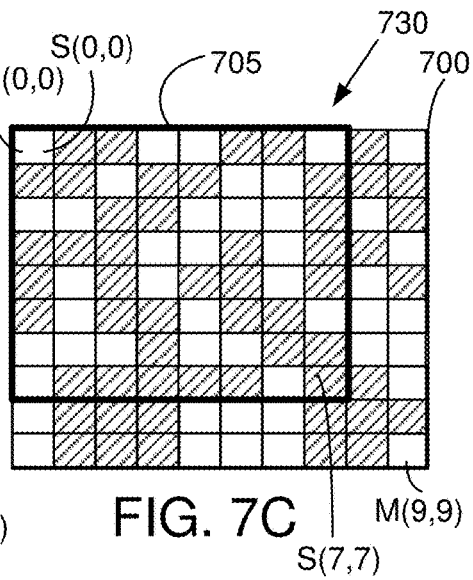
Figure 7E:
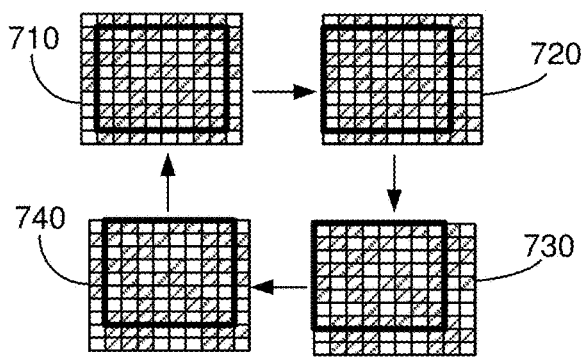
FIG. 7E illustrates a scan pattern associated with FIGS. 7A-7D.
Figure 7F:
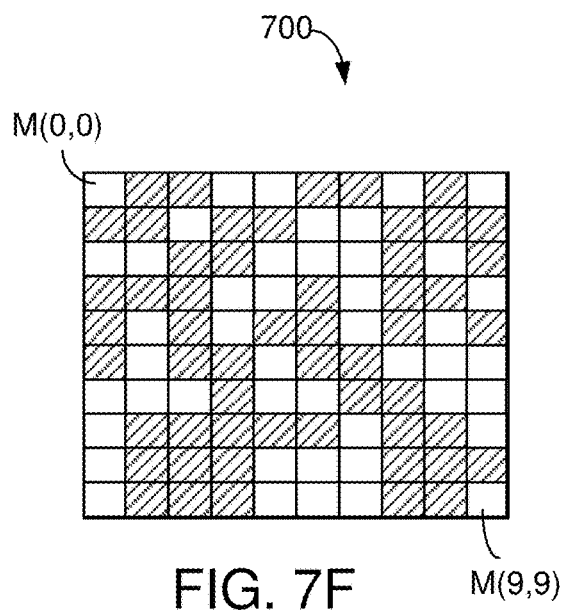
FIG. 7F illustrates a representative mask.
Figure 7G:
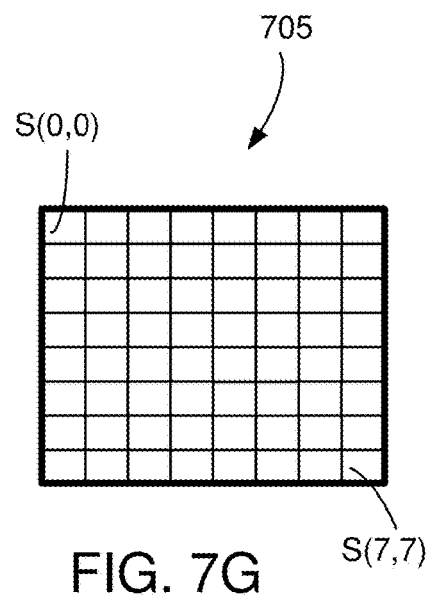
FIG. 7G illustrates a sensor array.

FIGS. 7A-7D illustrate movement of the mask 700 with respect to the sensor array 705 to obtain a compressed image. The mask 700 is shown in FIG. 7F and the sensor 705 is shown in FIG. 7G. FIGS. 7A-7D show different displacements 710, 720, 730, 740 of the mask 700 with respect to the sensor 705 and FIG. 7E illustrates a sequence in which the displacements of FIGS. 7A-7D are produced. These displacements are provided in a single sensor integration time. For ease of illustration, only displacements corresponding to a whole sensor/mask elements are shown, but during integrations, there are fractional displacements. As discussed above, the mask/sensor displacements 710, 720, 730, 740 can be provided by translating the mask 700 with respect to the sensor array 705 along one or more axes. In this way, image beam modulation can be obtained. In FIGS. 7A-7D, mask element spacing and size are selected to correspond to sensor element size and spacing, so that at certain times as the mask 700 is scanned, a single mask element corresponds to a single sensor element, but other sizes and spacings of mask elements and sensor elements can be used. A single mask element can correspond to multiple sensor elements.

For convenient illustration, mask and sensor elements are shown in FIG. 7A-7D without gaps. For example, the mask elements are shown as having selected attenuations that extend to adjacent mask elements. In some examples, transmissive apertures (or CPB blocking regions) associated with a mask element cover only a portion of an available mask area for the mask element. The sensor array area 705 can be further divided into subareas corresponding to mask element sizes and each mask element size can correspond to multiple sensor elements.

The amount of movement within an integration time of the sensor array 705 can determine an amount of compression within a video frame captured by the sensor array 705. In FIGS. 7A-7D, there are four distinct encodings at four different displacements during the integration time of the sensor array 705. As used herein, a distinct encoding is an encoding that differs from an earlier or later encoding by at least one mask element. The compression ratio can be proportional to the number of distinct encodings within the integration time of the sensor array 705, so the compression ratio is four in this example.

Figure 7H:
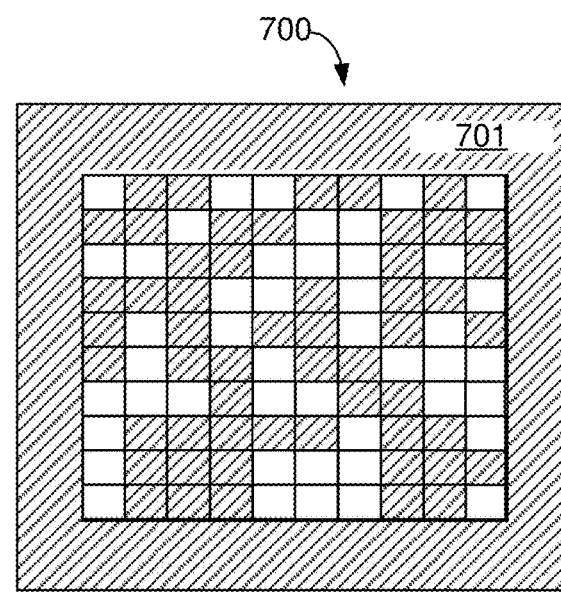
FIG. 7H illustrates the mask of FIG. 7F with a frame.

FIG. 7H is a further illustration of the mask 700, showing a frame 701 that surrounds the active area of the mask, and can be formed of the same material as the mask elements but for which patterning is not needed.

Figure 8:
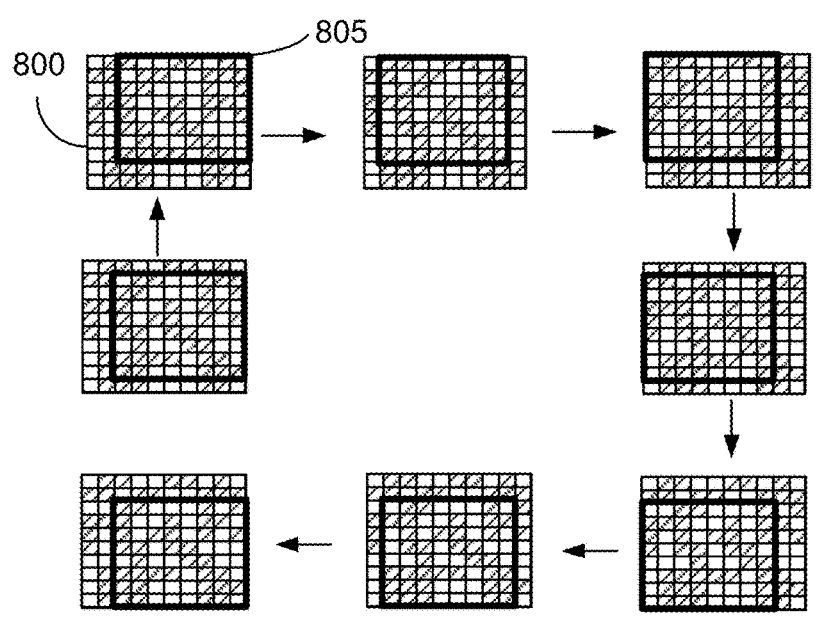
FIG. 8 illustrates another representative scan pattern.

FIG. 8 illustrates an example two-dimensional rectangular mask pattern 800 that is scanned with respect to a sensor array 805 to create a compression ratio of eight for a compressed video frame. The mask pattern 800 applies eight encodings to an incident beam within a sensor integration time, wherein each encoding is based on a displacement of at least one mask element from other encodings and is thus different from other encodings. In the example of FIG. 8, two vertical and two horizontal displacements are used.

Example 7

Masks and Methods

Masks are typically defined so as to include single piece active areas with enough mechanical structure to be self-supporting. In particular examples, non-transmissive areas of a mask provide mechanical structure and the transmissive mask area are defined by voids or holes. During manufacture, a substrate can be used for support and then removed or split from the mask elements. A mask can be fabricated in various ways such as by laser drilling, mechanical drilling, etching, and micro-electroplating. Micro-electroplating can provide desirable characteristics such as providing a well-defined aperture features of dimensions of between 5 µm and 20 µm, compatibility with materials that have suitable structural stability and electron stopping power even in thin layers, enabling mask elements having a small aspect ratio between top and bottom, providing long-range periodicity and reasonable cost. Mask generally define pattern areas associated with two different beam modulation values such as beam attenuations, beam phases, or other beam modulations.

FIG. 9A illustrates an example method 900 of generating a mask for a charged particle beam system using compressive sensing. At 910, photoresist can be deposited over an area of a substrate. The substrate can be used as support structure for the aperture mask during manufacture of the aperture mask. The substrate can be glass or silicon, for example. In one embodiment, the substrate can be conductive or can include a monoatomic or thicker layer of a conducting material on a substrate surface. A photoresist can be selected based on a variety of factors, such as a resolution or sensitivity of the photoresist, for example. The photoresist can be applied in various ways to produce a uniform thickness that is typically at least as thick as a CPB attenuating material to be deposited. In some examples, photoresist layers of thickness greater than 30 µm or greater than 100 µm are formed. A photoresist layer can be formed by spin coating, spray coating, or roller coating onto a substrate surface. The photoresist layer can be cured by air drying and/or by curing at a temperature exceeding room temperature, for example.

At 920, the photoresist is patterned to uncover or expose areas of the substrate corresponding to mask elements that are intended to be attenuating or non-transmissive to a CPB. In particular, the patterned photoresist layer can define photoresist areas corresponding to rectangular transmissive elements of a CPB mask and areas of exposed substrate corresponding to non-transmissive elements. A photoresist layer can be patterned by exposure to a positive or negative image of an intended mask pattern so as to selectively expose areas of the photoresist. The photoresist material can be a positive or negative photoresist which exhibits increased or decreased solubility after exposure. The photoresist is developed using a solvent or etchant that removes exposed or un-exposed areas, depending on whether a positive or negative photoresist is used. If a positive photoresist layer is used, photoresist areas corresponding to non-transmissive mask areas are removed by developing. Alternatively, if a negative photoresist layer is used, photoresist areas corresponding to the transmissive mask elements are exposed, and the photoresist at non-transmissive areas of the mask can removed.

At 930, a non-transmissive material is deposited over at least the exposed substrate areas. The non-transmissive material is deposited using electroplating, sputtering, evaporation, or other process to a thickness sufficient to produce a selected CPB attenuation. At 940, the patterned photoresist layer is removed along with any non-transmissive material deposited on the photoresist layer, and the substrate is removed from at least areas associated with mask elements that are to be transmissive. At 950, the mask is secured to a mechanical frame with glue, soldering, or other process. In some examples, a portion of the substrate to which photoresist is applied can be retained to serve as a frame.

Using electroplating for depositing a non-transmissive material may permit mask elements to have straighter, sharper edges. Such edges may improve image quality in a mask-modulated image by reducing reflections from sides of non-transmissive mask elements. In an alternative method, a material (such as a metal) is deposited at a desired thickness on a substrate and the resulting metal layer lithographically processed to remove the material at areas associated with transmissive mask elements. For example, a photoresist can be applied to a metal layer formed on a substrate. The photoresist layer can be patterned and exposed so that portions of the metal layer and the substrate associated with non-transmissive mask elements are exposed and can be etched to remove or thin. In some examples, such etching can create conical holes due to isotropic etching of the substrate that can result in reduced image quality due to reflections from the sides of the aperture mask.

Another method 970 of fabricating a radiation beam mask is illustrated in FIG. 9B. At 972, a photoresist layer is deposited on a beam attenuation layer, such as a gold layer that can be provided as a foil layer. For convenient processing, such beam attenuation layer can be secured to another substrate for simpler handling during processing. At 974, the photoresist layer is exposed to a mask pattern, and at 976, the photoresist is developed 976 so that portions of photoresist remain at mask areas that are to relatively more attenuating while at areas that are to be relatively less attenuating, the beam attenuation layer is exposed. The exposed areas of the beam attenuation layer are wet etched, dry etched, or ion beam milled at 978 to reduce beam attenuation layer thickness, and in some examples, holes in the beam attenuation layer are formed. In some cases, directly etch or milling processes are preferred. At 980, the photoresist layer is removed, and the patterned beam attenuation layer can be secured to a frame.

In other alternatives, a beam attenuating layer is directly machined by ion beam milling or other process without a photoresist protective layer. In some examples, a beam attenuation layer on a substrate is processed to define mask areas having different attenuations. The substrate is selected to be substantially transparent to a radiation beam, and typically has a transmittance of at least 10%, 25%, 50%, of 75%. In representative examples, masks include patterned beam attenuation layers or portion=s thereof on silicon nitride, silicon dioxide, or silicon layers of thicknesses between about 10 nm and 20 μm, typically between 10 nm and 40 nm. With sufficiently thin substrates, the beam attenuating layer need not be separated.

Example 8

Representative Materials

The desired thickness can be based on a variety of factors such as a blocking power of the non-transmissive material and a mechanical strength of the non-transmissive material. A relationship of thickness and blocking power for two materials is described further below with respect to FIGS. 10A-10B. A material for the non-transmissive areas can be selected based on a variety of factors, such as cost, mechanical strength, magnetic properties, and blocking or stopping power. Properties of suitable aperture materials can include being non-magnetic (e.g., having a low relative permeability) and having a high blocking power for electrons, such as having a high atomic number. By selecting non-magnetic materials, images can exhibit less distortion than by using magnetic materials that can deflect the CPBs transmitted by the mask. High-Z materials also permit thinner layers and tend to reduce reflections from the side-walls of transmissive areas. Suitable aperture materials can include various transition metals having atomic numbers in a range of 72 to 80. Typical examples of suitable materials include glass, gold, platinum, iridium, osmium, nickel, and copper, and combinations thereof.

Figure 10A:
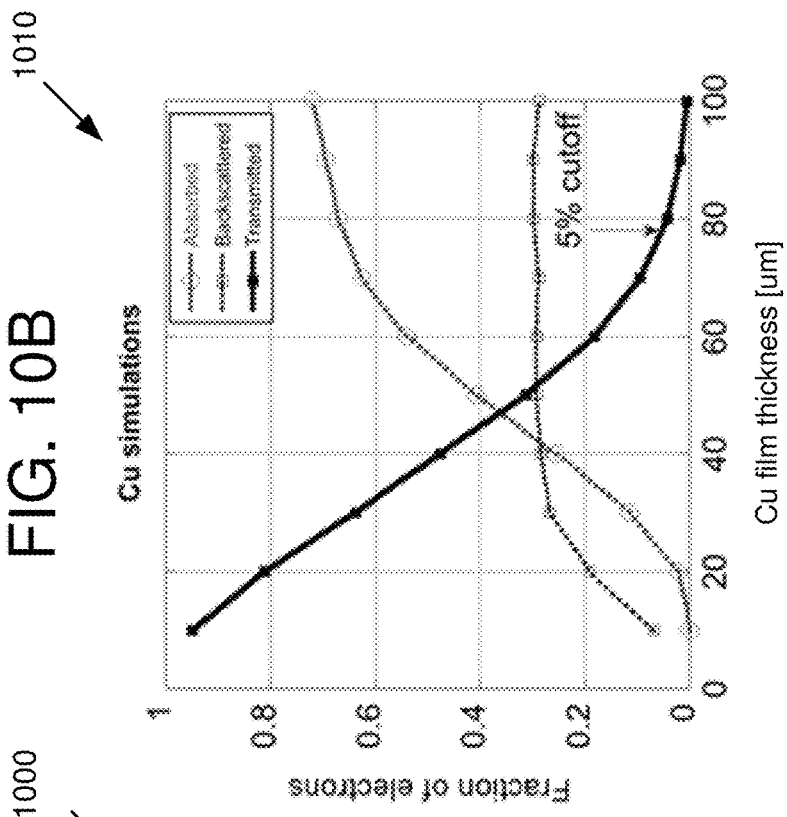
FIGS. 10A-10B illustrate simulated electron beam absorption and scattering characteristics for gold and copper.
Figure 10B:
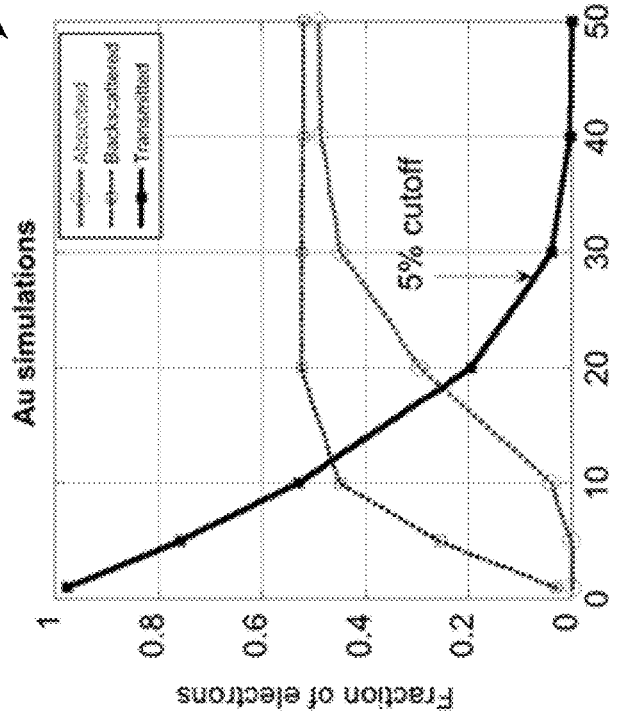

The thickness of attenuating material in non-transmissive mask elements can be based on the material and a desired attenuation. As one example, the thickness can be between 30 μm and 200 μm, depending on the material. FIGS. 10A-10B show simulated electron beam transmission, backscatter, and absorption as a function of layer thickness for gold and copper, respectively. As shown in FIGS. 10A-10B, to obtain 95% blocking, thicknesses of gold and copper of 30 μm and 80 μm, respectively, are needed. To obtain 20% transmittance, a 20 μm gold layer or a 58 μm copper layer is needed. In other examples, non-transmissive mask elements are defined by nickel in thicknesses similar to those required for copper. A glass layer about 200 μm can be used to achieve about 5% transmittance.

In one embodiment, non-transmissive mask elements are defined by a gold layer 20 μm to 40 μm thick, or a copper layer 60 μm to 90 μm. In some examples, thinner layers are preferred to reduce reflections from sides of the mask elements. Thicker layers provide superior mechanical strength. In some examples, a mask is mounted in a frame to provide additional structural stability.

Example 9

Representative Masks

FIGS. 11A-11B illustrate representative masks 1100, 1100 in which non-transmissive areas are illustrated as dark areas and transmissive areas are illustrated as light areas. As described above, the transmissive areas can be holes, voids, or thinned regions of a substrate or absorbing layer. Non-transmissive areas are provided with a thicker layer of an absorbing layer than that associated with transmissive areas, or a more absorbing material or a less thinned substrate. In some examples, the transmissive areas are rectangular areas that are selected to be randomly or pseudo-randomly distributed across an active area of a mask and can be selected so as to satisfy a restricted isometry property (RIP) associated with compressive sensing reconstruction, but mask patterns can be selected in other ways as well. Generally, a mask satisfying the RIP property can have a transmissivity of up to 50%. However, the transmissivity may be lower (such as 40-45%) to provide sufficient structure for a self-supporting aperture mask. In some examples, the mask elements satisfy pseudo-random or random arrangements are used.

Example 10

Mask Pattern Selection

The spatial arrangement of the transmissive and non-transmissive areas in a mask can be determined using a random or pseudorandom placement of transmissive and non-transmissive elements constrained by suitable design rules. The design rules can include rules to maintain structural support for the aperture, rules for a maximum non-transmissive area, rules for a minimum-size step area (e.g., a minimum sized area for a repeating pattern), rules for a maximum run-length, and/or rules for a maximum diagonal length. Repeated or periodic patterns of transmissive and non-transmissive areas are generally disfavored as periodic patterns can create support or grid lines that always block some sensor elements. Patterns that are connected from one corner of a mask to an opposite corner of a mask along a diagonal may have a tendency to flop as the aperture is moved, and tend to be associated with reduced imaging performance and reduced mask lifetime. A random pattern of mask elements exhibiting local connectivity may be preferred than a less random pattern over larger distances.

Various approaches can be used to generate a pattern for the mask. In some cases, mask element dimensions are sufficiently large that a single mask element maps to multiple sensor elements of a sensor array. In either approach, all mask elements can be initialized to be non-transmissive and then transmissive mask elements can be added to the mask pattern to make the pattern more transmissive. Mask element dimensions can be selected based on a sensitivity of the photoresist used to manufacture the aperture and/or desired optical properties of the aperture mask pattern. The feature size of the mask can specify the smallest dimension for a transmissive and/or non-transmissive area. The feature size of the mask can be based on a size of one or more sensors of the sensor array. In particular, the feature size of the mask can be a multiple of the sensor size, such as between three and four times the area of a sensor of the sensor array. As a specific example, an individual sensor can be a square that is 6.4 µm on a side, and the feature size of the mask can be about 25 µm along one dimension so that a smallest transmissive area can overlay a 2×2 array of sensor elements.

A mask pattern can include a grid or webbing of non-transmissive areas that can be used as a support structure for the mask. The transmissive areas can be randomly binned or selected to be placed within regions bounded by the gridlines. Thus, there can be a random distribution of ON (binned) transmissive areas and OFF (not binned) non-transmissive areas across the area of the aperture mask. The distribution of ON and OFF binned pixels can be selected to have a sparse random distribution that satisfies the restricted isometry property for CS reconstruction. The support webbing can potentially reduce the overall transmission through the mask which can reduce the resolution at the sensor array detector.

Prior to mask construction, a mask pattern is generated evaluated to determine if appropriate for CS applications. Of course, a mask having the pattern can be used to make measurements, but CS simulation is generally preferred. Model signal data or image data is modulated with the mask pattern, and the modulated data or image processed to produce a final decompressed output. This output can be evaluated based on spatial or temporal resolution, probable sample dose, and signal-to-noise ratio. If satisfactory, the pattern can be used to define a physical mask.

In FIG. 12, non-transmissive mask regions are illustrate with shading; transmissive areas are shown without shading. A mapping to a sensor array is illustrated by a grid 1221 within the area 1220. Initially, all portions of a representative area 1220 (or all regions of an entire mask) are selected to be non-transmissive. Mask regions within the area 1220 are then grouped into clusters having various shapes and sizes. For example, transmissive mask elements can range in size from a minimum size to a maximum size. As a specific example, a random width and a random height between the minimum size and the maximum size can be selected. In one example, mask feature width is selected to correspond to a width of three sensors elements of a sensor array. A transmissive element (cluster) of minimum size is shown as mask area 1222. Since transmissive areas can have different widths and different heights, transmissive mask areas can have different aspect ratios. As another example, a random aspect ratio and orientation can be selected for a transmissive mask region. As a specific example, transmissive mask regions (clusters) 1223 and 1224 have a common aspect ratio (4/5), but different orientations. The mask region 1223 is oriented to have height along a Y-axis that is greater than a width along an X-axis; the mask region 1223 is oriented to have a height along the Y-axis that is less than a width along the X-axis. In some examples, aspect ratios of mask regions can vary between one and six, or between one and four.

Positions of transmissive clusters can be selected to be semi-random so that the clusters do not define a periodic grid but instead are randomly offset by an amount that is consistent with sensor element spacing, taking into consideration any CPB or light optical magnification or demagnification. In one example, the random offset can correspond to a multiple of a sensor element dimension. As a specific example, an upper-left corner of region 1225 is offset from an upper-right corner of region 1221 by two sensor elements in both an X-direction and a Y-direction. As another example, an upper-left corner of pixel 1223 is offset from the upper-right corner of pixel 1225 by one sensor element in the Y-direction and three sensor elements in an X-direction. The offsets can be selected so that the transmissive regions or clusters are non-overlapping. In one embodiment, each of the transmissive regions is separated by at least 5 µm.

Transmissive regions can be added to the mask pattern until the mask is fully populated. For example, the pixels can be added in a recursive or iterative manner until an end condition is met. As a specific example, a first pixel can be selected in a corner (e.g., the upper-left corner) of the aperture mask. The first pixel can have a semi-random size, aspect ratio, and/or orientation. Two additional pixels can be selected at offsets from the first pixel. For example, a second pixel can be selected in a horizontal direction from the first pixel and a third pixel can be selected in a vertical direction from the first pixel. The algorithm can continue where each pixel spawns two more pixels, until an edge of the mask is reached and no more pixels can be added.

Aperture mask pattern 1100 was designed with more uniform pixels than the aperture mask pattern 1110. In particular, the aspect ratios of the pixels have a larger variance for the pattern 1110 than for the pattern 1100. By clustering mask elements, a webbing separating mask elements becomes an active component of the mask. For example, the effective transmissivity can potentially be adjusted up to 50%. In one embodiment, a mask can be generated with mask element clustering where the transmissive areas of the mask cover 40% to 50% of an active area of the mask and have a feature size of 10 to 60 µm on a respective side. In another embodiment, a mask can be generated wherein the transmissive regions cover between 30% and 50%, 40% and 50%, or 45% and 50% of mask active area. Mask regions can have lengths and/or widths are between 5 µm and 20 µm, 10 µm and 30 µm, or 5 µm and 50 µm or other dimensions.

Masks are typically defined by patterning a CPB absorbing layer on a substrate, and then separating the patterned CPB absorbing layer from the substrate. In other examples, patterns can be defined on thin membranes so that transmissive areas correspond to areas of the thin membrane while non-transmissive areas are defined by a suitable material situated on the membrane. With such membrane-based masks, a patterned CPB absorbing layer need not be self-supporting.

Example 11

Single Sensor Systems

Figure 13:
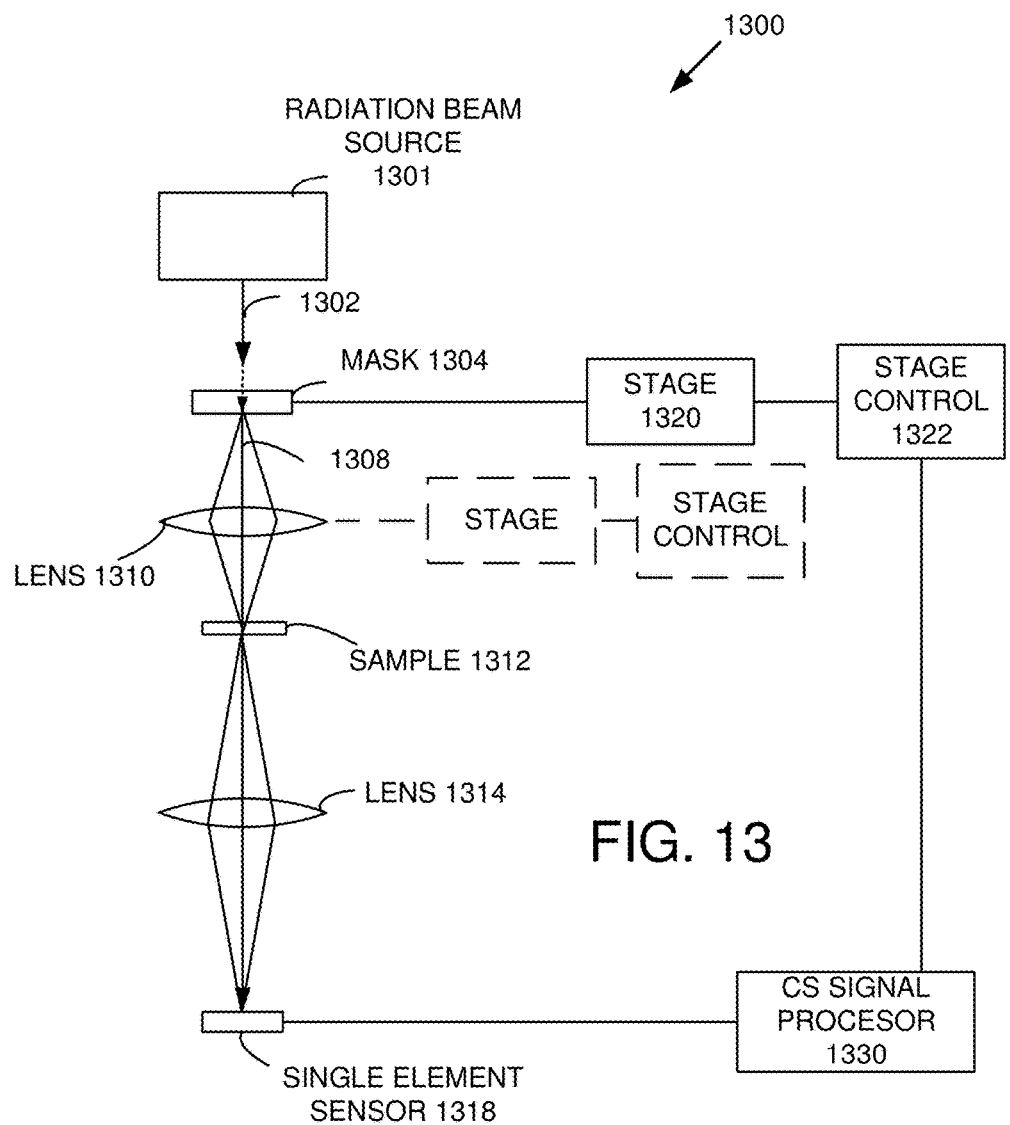
FIG. 13 illustrates an example imaging system that includes a single element radiation sensor.

With reference to FIG. 13, a single sensor image system 1300 includes a radiation source that directs a beam 1302 to a mask 1304 that is coupled to a stage 1320. A stage controller 1322 is connected to the stage 1320 to direct stage motions such as translations about one or more axes. (A possible alternative arrangement of a stage coupled to a lens 1310 is also shown.) The lens 1310 is situated to receive a mask modulated beam 1308 from the mask 1304 and image the mask 1304 at a sample 1312. In some examples, the mask 1304 and the sample 1312 are sufficiently close that the lens 1310 is not used, typically dependent on the extent to which the beam is collimated. A lens 1314 images the sample 1312 (as irradiated by a patterned beam from the mask 1312) so that beam radiation from a selected sample area (or an entire area of interest) is received by the single element sensor 1318 (or by a single element of a sensor array). By acquiring a series of such sample area images with differing mask patterns (obtained by, for example, displacement of the mask), an image of a specimen area can be obtained with a single element sensor.

Example 12

Transmissive Imaging with Alternative Mask Placements

Figure 14:
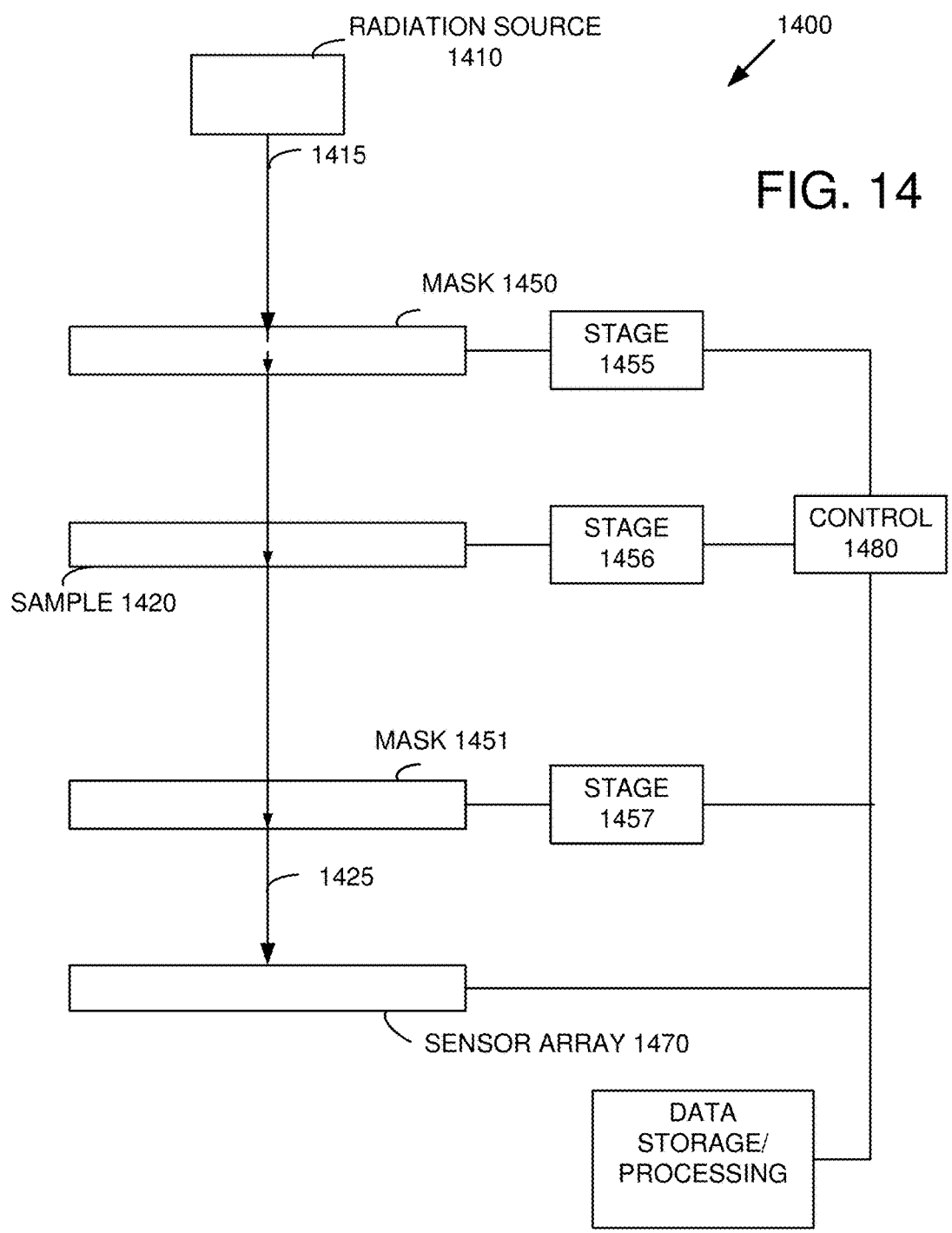
FIG. 14 illustrates an additional representative transmission imaging system showing alternative locations for a beam modulator.

A representative transmissive imaging system 1400 including a radiation source 1410 and a modulator 1430 is illustrated in FIG. 14. The radiation source 1410 can generate electromagnetic radiation such as x-rays, gamma rays or light at infrared, near infrared, far infrared, and/or ultraviolet spectra wavelengths. As specific examples, the radiation source 1410 can generate electromagnetic waves with wavelengths in the ranges of 0.01-1 nm, 10-100 nm, 400-700 nm, or 800-1200 nm, photon energies greater than 5 eV, 10 eV, 100 eV, 1 keV or greater. The radiation source 1410 can also include a suitable optical system for shaping and directing a radiation beam 1415. In some examples, the radiation beam 1415 is collimated while in other examples, the radiation beam is focused or otherwise processed to have a selected beam divergence and beam size, suitable irradiating a target of interest.

The radiation beam 1415 can be transmitted through the sample 1420 and modulated by one or more masks 1450, 1451 or by varying displacement of the sample 1420 with respect to one or more of the masks 1450, 1451 to form a mask-modulated image beam 1425. Variations in intensity, phase, wavelength, direction of propagation, or other characteristics in the mask modulated image beam 1425 are associated with differences in structure and/or composition of the sample 1420. As shown in FIG. 14, the image can be spatiotemporally modulated using displacement of a beam with respect to either of the masks 1450, 1451 or by movement of the sample 1420 with respect to either of the masks 1450, 1451. For some types of radiation, the mask modulated image beam 1425 can also be modulated by moving or scanning the beam 1415. For example, for infrared radiation beams, beam scanning can be provided with a polygonal mirror or galvanometer based scanning system. In order to avoid or reduce beam displacements at a sensor array 1470, such scanning systems can be provided both before and after the radiation beam 1415 interacts with the sample 1420. As one typical example, the image beam is modulated by mechanically moving the mask 1450 using a translation or positioning stage 1455. The positioning stage 1455 can be coupled to the mask 1450 that is scanned with respect to the image 1425 to produce a mask-modulated image beam 1435. A sensor array 1470 receives the mask-modulated image beam 1435 and integrates for a time duration established by a controller 1480, or otherwise determined. Acquisition of the modulated image beam 1435 can be synchronized with the sensor array 1470 to capture a single compressed image or multiple compressed images in a video.

The mask 1450 applies a spatial encoding to the image beam 1425 based on an arrangement of mask areas that are associated with differing transmittances, spectral transmittance, beam diffraction or deflection, phase, or other beam characteristics. In a convenient examples, differences in transmissivity are used and the mask 1450 includes areas associated with at least first and second beam attenuations. For convenient description, such areas are referred to as transmissive and non-transmissive. The pattern of the transmissive and non-transmissive areas of the mask 1450 can be generated using the same methods as for generating the CPB masks. Alternatively, the mask 1450 can include a transmissive substrate with a patterned reflective or absorptive layer. As a specific example, the mask 1450 can be a chromium on glass mask. The glass substrate can be of suitable thickness so that it is rigid and supports the mask. The chromium layer can be deposited on the glass by using a lithographic process. In particular, the non-transmissive areas are associated with chromium or other metallic on the substrate and transmissive areas are associated with areas that do not have such metallic coatings. For some types of radiation beams, suitable transmissive substrates are available so that any layers that define a variable transmission pattern need not be self-supporting. Non-transmissive areas and/or transmissive areas can be discontinuous as well in contrast to some examples of CPB masks in which a mask is defined in a single metallic layer.

Example 13

Transmissive Diffraction Imaging

Figure 15:
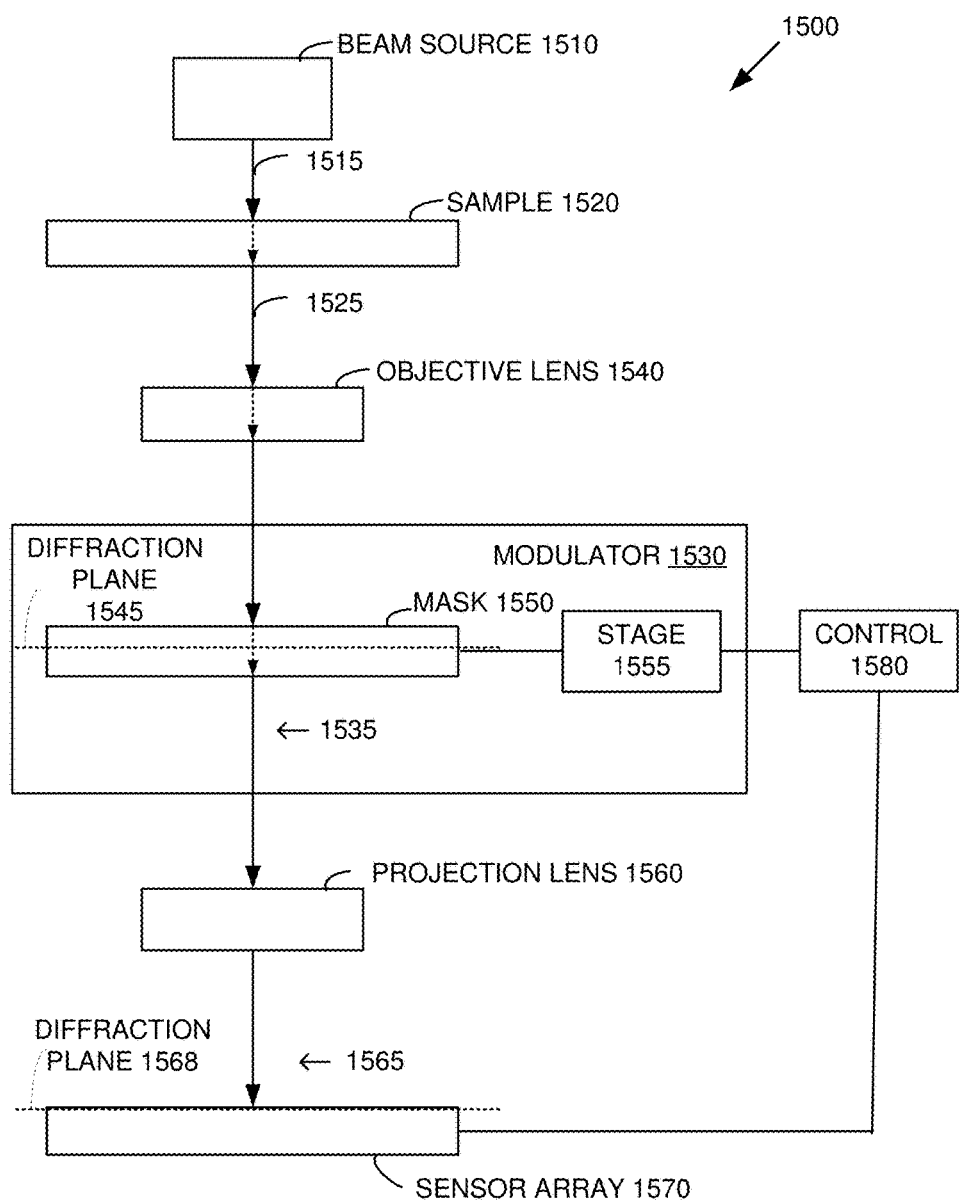
FIG. 15 illustrates a transmission CPB diffraction imaging system.

A representative transmissive diffraction imaging system 1500 is illustrated in FIG. 15. The system 1500 can include a beam source 1510 configured to emit a beam 1515. A sample 1520 can be situated so that it is irradiated by the beam 1515 to produce an image beam 1525. The image beam 1525 can be focused by an objective lens 1540 to form an image. The objective lens also a diffraction pattern at a Fourier transform plane 1545. The Fourier transform plane is referred to herein as a "transform" plane or a "diffraction" plane as well and is situated at a back focal plane of the objective lens 1540, the mask 1550 can be situated to receive the focused image beam from the sample. A modulator 1530 includes a mask 1550 that is situated at the transform plane 1545 so as to apply a mask modulation to a diffraction pattern associated with the sample 1520. In one example, the modulator 1530 can include a displacement stage 1555 coupled to the mask 1550. The modulator 1530 can be configured to produce a mask-modulated diffraction beam 1535 based on relative displacements of the mask 1550 and the diffraction beam. The relative displacements can be associated with a predefined periodic scan pattern that is controlled by a controller 1580. The modulated diffraction beam 1535 can be focused by a projection lens 1560 to t a transform plane 1568 t a sensor array 1570 so that the sensor array 1570 receives a modulated diffraction pattern. The sensor array 1570 can be synchronized with the modulator 1530 so that at a portion of the periodic scan pattern is followed during an integration period of the sensor array 1570. The projection lens 1560 and the objective lens 1540 can also be configured to direct a mask-modulated sample image to the sensor array 1570 instead of a mask-modulated diffraction pattern. Such lens adjustment are particularly simple in CPB imaging in which control of currents and or voltages applied to CPB lenses can be used to select whether a sample image or a sample diffraction pattern is directed to the sensor array 1570.

Example 14

Additional Representative Mask

A representative mask 1600 and a magnified portion 1610 of the mask 1600 are illustrated in FIG. 16. The mask 1600 is a single-piece self-supported mask pattern. The non-transmissive area 1620 represented by the black areas is a constant width between the transmissive openings (such as the opening 1630). Preferably, different transmissive openings can have different sizes, orientations, and aspect ratios.

Example 15

Additional Examples

The examples discussed above tend to emphasize the acquisition of video sequences using mask-modulation of image beams. In some application, the disclosed methods and apparatus are arranged to acquire images or video sequences with reduce exposure to radiation beams. For example, the disclosed methods can be applied to acquisition of electron beam images or image sequences with reduced electron beam exposure to avoid electron beam induced damage. In some cases, the disclosed methods permit more rapid image data acquisition, with or without increasing spatial or temporal resolution. As noted above, in one example, the disclosed methods and apparatus permit increased temporal resolution so that sample changes during exposure to electron beams or other radiation can be investigated.

As one example, a method for transmission electron microscopy imaging includes acquiring a series of temporally compressed images using a coded aperture or mask, and reconstructing the images using compressive sensing. The images can be coded and integrated into a single frame during the acquisition. For example, the coded aperture or mask can enable the images to be compressed during an integration period of a camera. The camera can be a CCD camera or a direct detection camera. The mask can be positioned between a sample and the camera. The mask can be moved during the integration period and the position and speed of the mask can be determined by a function generator. For example, the mask can be coupled to a piezoelectric element driven by the function generator at a rate faster than the integration period of the camera. The time resolution of the images can be increased as the speed of the piezoelectric element is increased. A translation range of the mask can increase the number of images per second.

As another example, a system for transmission electron microscopy includes a coded aperture or mask for producing a series of temporally compressed images, and a piezoelectric element to move the mask. Movement of the mask can induce the temporal compression during a camera integration. The temporally compressed images can be reconstructed by using a compressive sensing algorithm. The system can include a camera (such as a CCD camera or a direct detection camera), and the coded aperture or mask can enable the images to be compressed during integration on the camera. The mask can be positioned between a sample and the camera. The piezoelectric element can be driven by a function generator at a rate faster than an integration period of the camera. The position of the mask can be determined by the function generator. Increasing a translation range of the mask can increase the number of temporally compressed images per second. The time resolution of the images can be increased by increasing the speed of the piezoelectric element. The function generator can also control reading and recording of the system.

As another example, a method of transmission electron microscopy imaging, spectroscopy and/or spectrometry includes modulating a beam to induce an encoded signal intended for compressive recovery and reconstructing images from the encoded signal. For example, the images can be reconstructed using a compressive sensing reconstruction algorithm. The beam can be an electron beam, a neutron beam, an ion beam, an x-ray beam, or an electromagnetic wave. The beam is modulated either before or after transmission through or reflection from a sample. The encoded signal is acquired either stochastically or deterministically by one or more of: shifting of the image and/or spectrum location, size, contrast, focus, intensity, or selection of specific signal components. The modulation can be controlled by a stationary aperture or a moving aperture so that the images are shifted relative to the aperture. In one embodiment, the images are shifted relative to the aperture by applying an electrostatic field to an electron beam during generation or propagation in the microscope. In another embodiment, the images are shifted relative to the aperture by moving the aperture using a piezoelectric stage. The aperture can be a random or a deterministic coded aperture.

As another example, a system for transmission electron microscopy includes an electron source for emitting an electron beam, and an electrostatic field to induce shifting of image location, size, contrast, focus or intensity relative to an aperture or detector. The images are reconstructed, such as by using a compressive sensing reconstruction algorithm. The aperture can be a random or a deterministic coded aperture. The aperture can be stationary or moveable.

As another example, a method for transmission electron microscopy imaging includes acquiring a series of temporally compressed images using a coded aperture or mask, and reconstructing the images using a compressive sensing reconstruction algorithm. The images can be coded and integrated into a single frame during the acquisition of the images. For example, the coded aperture or mask can allow the images to be compressed during integration on a camera. The camera can be a CCD camera or a direct detection camera. The mask can be positioned between a sample and the camera or on/in the camera. The mask can move and the position and speed of the mask can be determined by a function generator. For example, the mask can be coupled to a piezoelectric element driven by the function generator at a rate faster than the camera. The time resolution of the images can be increased by the speed of the piezoelectric element. The translation range of the mask can increase the number of images per second.

As another example, a system for transmission electron microscopy includes a coded aperture or mask for producing a series of temporally compressed images, and a piezoelectric element to move the mask. The movement of the mask can induce the temporal compression during a camera integration. The images can be reconstructed by a compressive sensing algorithm. The system can include a camera, and the coded aperture or mask can allow the images to be compressed during integration on the camera. The mask can be positioned between a sample and the camera. The piezoelectric element can be driven by a function generator at a rate faster than a frame time of the camera. The position of the mask can be determined by the function generator and a translation range of the mask can determine the compression rate or number of images per-camera frame. For example, an increased translation range of the mask can increase the number of images per second. A framerate of recovered video can be determined by a translation range of the mask. The camera can be a CCD camera or a direct detection camera. The function generator can control reading and recording of the system.

Example 16

Example Computing Environment

Figure 17:
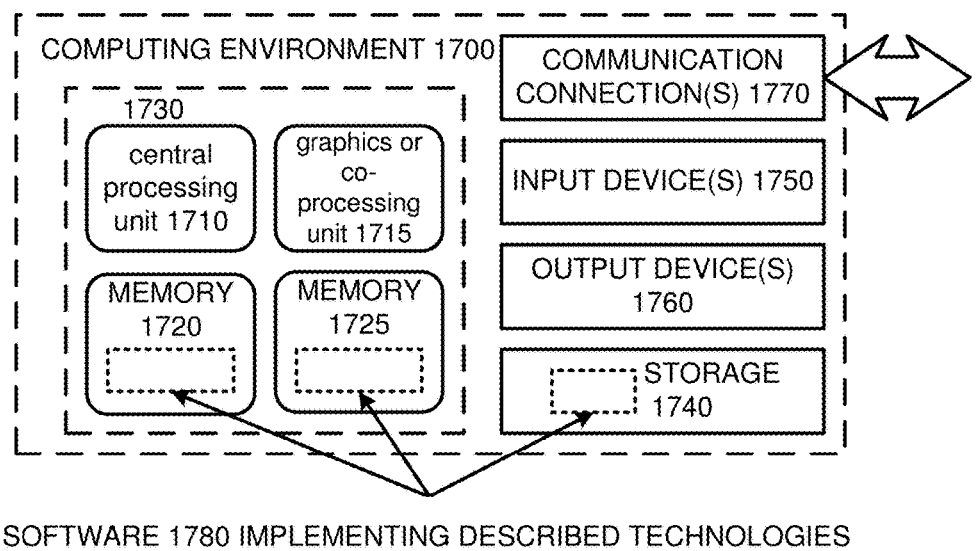
FIG. 17 is a block diagram illustrating a suitable computing environment for implementing some embodiments of the disclosed technology.

FIG. 17 depicts a generalized example of a suitable computing environment 1700 in which the described innovations such as image processing and mask pattern definition may be implemented. The computing environment 1700 is not intended to suggest any limitation as to scope of use or functionality, as the innovations may be implemented in diverse general-purpose or special-purpose computing systems. For example, the computing environment 1700 can be any of a variety of computing devices (e.g., desktop computer, laptop computer, server computer, tablet computer, etc.).

With reference to FIG. 17, the computing environment 1700 includes one or more processing units 1710, 1715 and memory 1720, 1725. In FIG. 17, this basic configuration 1730 is included within a dashed line. The processing units 1710, 1715 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 17 shows a central processing unit 1710 as well as a graphics processing unit or co-processing unit 1715. The tangible memory 1720, 1725 may be volatile memory (e.g., registers, cache, RAM), non-volatile memory (e.g., ROM, EEPROM, flash memory, etc.), or some combination of the two, accessible by the processing unit(s). The memory 1720, 1725 stores software 1780 implementing one or more innovations described herein, in the form of computer-executable instructions suitable for execution by the processing unit(s).

A computing system may have additional features. For example, the computing environment 1700 includes storage 1740, one or more input devices 1750, one or more output devices 1760, and one or more communication connections 1770. An interconnection mechanism (not shown) such as a bus, controller, or network interconnects the components of the computing environment 1700. Typically, operating system software (not shown) provides an operating environment for other software executing in the computing environment 1700, and coordinates activities of the components of the computing environment 1700.

The tangible storage 1740 may be removable or non-removable, and includes magnetic disks, magnetic tapes or cassettes, CD-ROMs, DVDs, or any other medium which can be used to store information in a non-transitory way and which can be accessed within the computing environment 1700. The storage 1740 stores instructions for the software 1780 implementing one or more innovations described herein.

The input device(s) 1750 may be a touch input device such as a keyboard, mouse, pen, or trackball, a voice input device, a scanning device, or another device that provides input to the computing environment 1700. The output device(s) 1760 may be a display, printer, speaker, CD-writer, or another device that provides output from the computing environment 1700.

The communication connection(s) 1770 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Example 17

Diffraction Pattern Imaging

Figure 18:
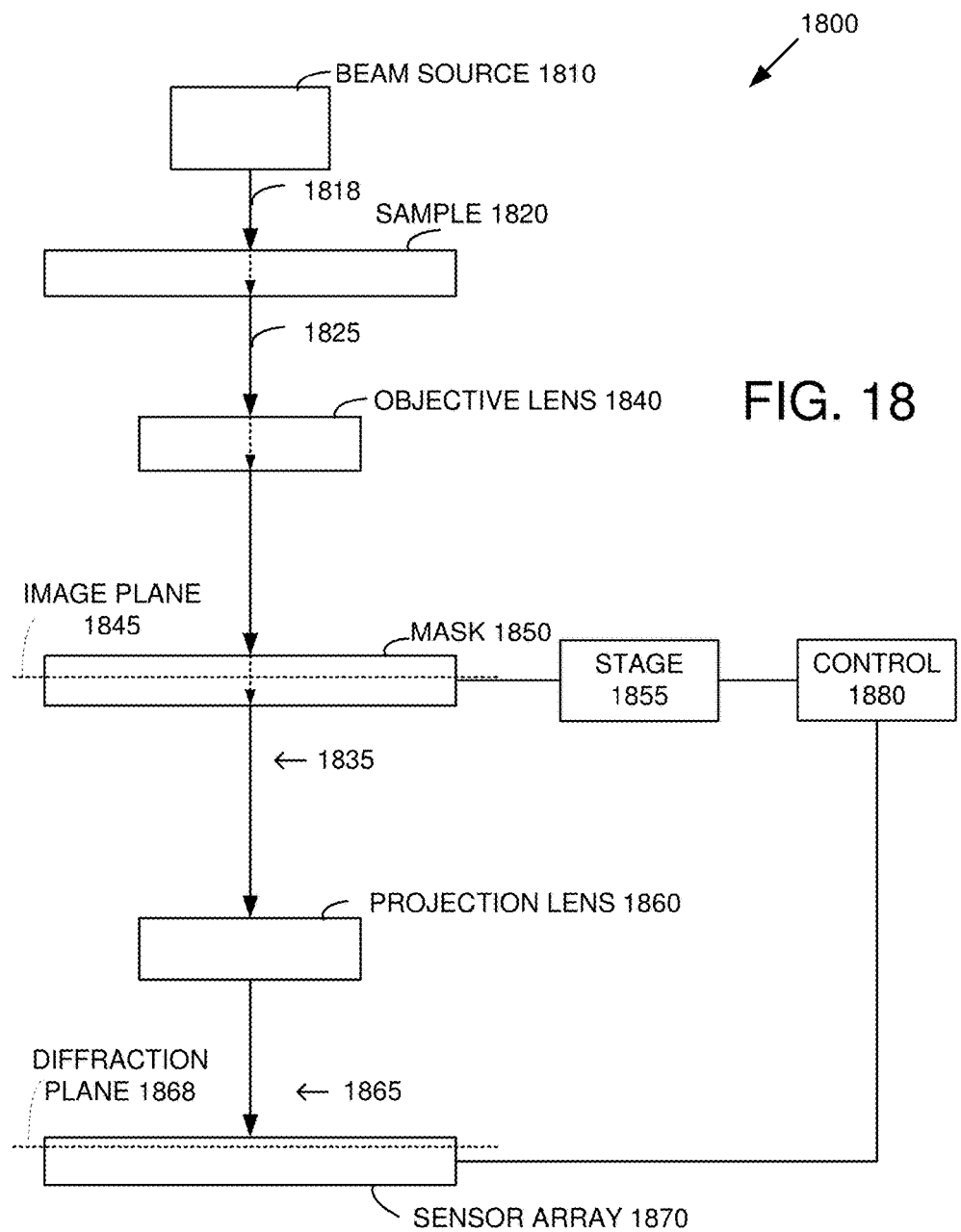
FIG. 18 illustrates a diffraction imaging system.

With reference to FIG. 18, an imaging system 1800 includes a beam source 1810 that directs a beam 1818 to a sample 1820. An objective lens 1840 is situated to receive the beam 1818 from the sample 1818 and image the sample 1820 at a mask 1850 that is coupled to a stage 1855 and a stage controller 1880. A mask modulated beam 1835 from the mask 1850 is directed to a projection lens 1860 and a sensor array 1870 is situated in a transform plane associated with the projection lens 1860. The transform plane is conveniently a back focal plane of the projection lens 1860.

Example 18

Diffraction Pattern Imaging

Figure 19:
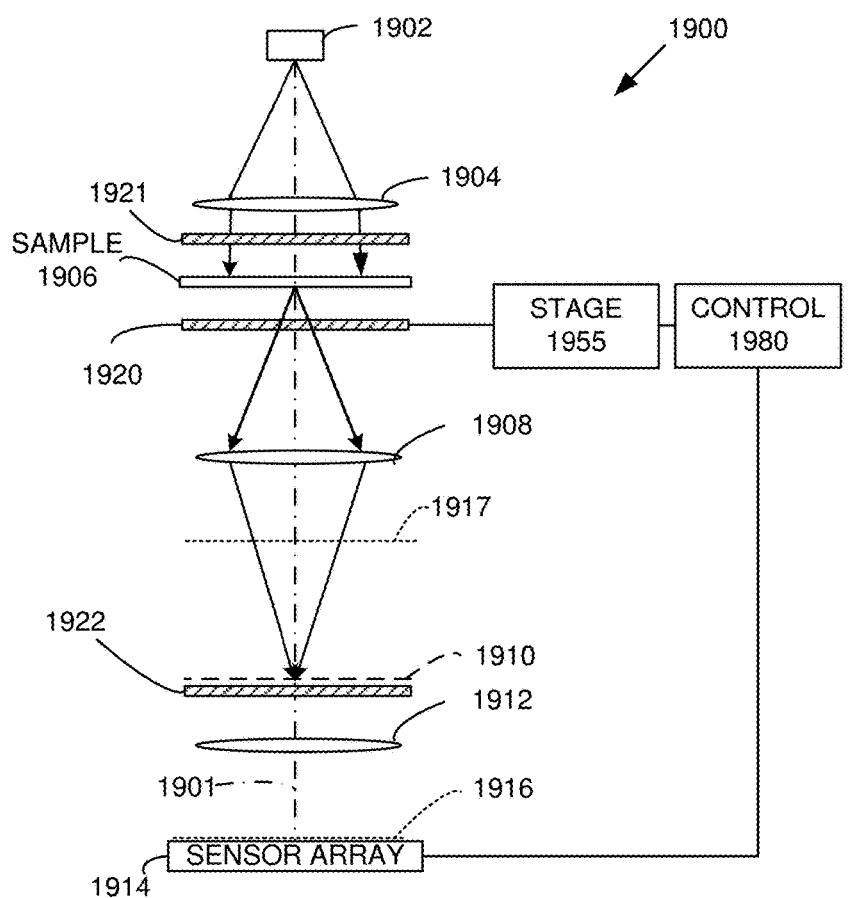
FIGS. 19-20 illustrate additional diffraction imaging systems that use mask modulation or modulation of other parameters of an imaging system.

With reference to FIG. 19, an electron microscope system 1900 includes an electron beam source 1902 that directs an electron beam along an axis 1901 to a condenser lens 1904. The condenser lens 1904 shapes the electron beam and directs the electron beam to a sample 1906 that is imaged by a lens 1908 that forms a sample image at an image plane 1910. A second lens 1912 is situated along the axis 1901 to re-image the sample image. However, in the example of FIG. 19, a second image is not formed and instead a sensor array 1914 is situated at a back focal plane 1916 of the second lens 1912 so that a Fourier transform or diffraction pattern associated with the sample 1906 is received by the sensor array 1914. The beam received at the sensor array 1914 can be mask-modulated with a mask 1920 that provides a variable beam modulation based on displacements of the mask 1902 produced by a state 1955 as directed by a controller 1980. A series of mask modulated sensor array signals can be processed as described above to produce a diffraction or Fourier transform based image of the sample 1906. In some examples, a series of masks can be used, or the electron beam can be scanned to produce the modulated beam received by the sensor array 1914. Masks can also be situated at alternative locations so as to modulate the electron beam prior to the sample (e.g., mask 1921), in proximity to and downstream of the sample (e.g., mask 1920), or at or in proximity to an image plane (e.g., mask 1922). In addition, the sensor array can be situated at other locations such as at a back focal plan 1917 of the lens 1908 or in a so-called far field region.

The example of FIG. 19 is described with reference to electron beam systems, but in other examples, other types of radiation are used. For some types of radiation, sensor arrays may not be readily available or practical, and single sensors can be used instead to obtain suitable transform plane data.

Example 19

Diffraction Images

Compressed image data can be obtained by using modulations based on variations in focus, beam angle, image magnification, electrical or magnetic deflection or other beam modulation, or for CPB systems, based on interactions with adjacent CPBs. Compressive sensing approaches that provide phase retrieval can be used. The modulated (i.e., compressed) image data can then be used to reconstruct diffraction images that include both phase and amplitude, so that images can be associated with phase, amplitude, or a combination of phase and amplitude.

Example 20

Mask-Less Diffraction Pattern Imaging

Figure 20:
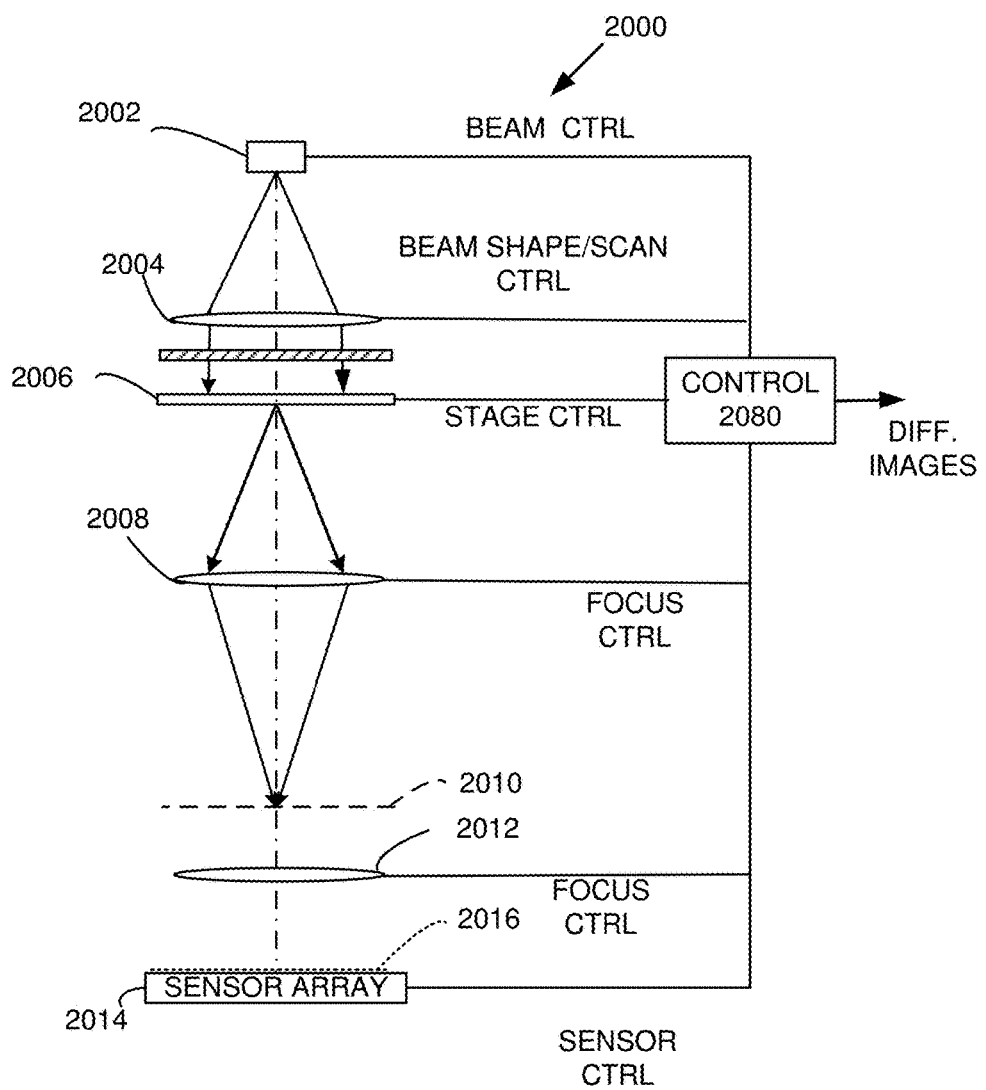

With reference to FIG. 20, an electron microscope system 2000 similar to that of FIG. 19 includes an electron beam source 2002 that directs an electron beam along an axis to a condenser lens 2004. The condenser lens 2004 shapes the electron beam and directs the electron beam to a sample 2006 that is imaged by a lens 2008 that forms a sample image at an image plane 2010. A second lens 2012 is situated along the axis 2001 to re-image the sample image. However, in the example of FIG. 20, a second image is not formed and instead a sensor array 2014 is situated at a back focal plane 2016 of the second lens 2012 so that a Fourier transform or diffraction pattern associated with the sample 2006 is received by the sensor array 2014. The beam received at the sensor array 2014 can be modulated with by modulation of a beam current or other beam characteristic, lens focus (for example, of the lenses 2008, 2012 or a sample location using controller 2080. A series of modulated sensor array signals can be processed as described above to produce a diffraction or Fourier transform based image of the sample 2006. The example of FIG. 20 is described with reference to electron beam systems, but in other examples, other types of radiation are used. Amplitude, phase or combined amplitude and phase can be produced.

Alternatives and Variations

Any of the disclosed methods can be implemented as computer-executable instructions or a computer program product stored on one or more computer-readable storage media (e.g., non-transitory computer-readable media, such as one or more optical media discs such as DVD or CD, volatile memory components (such as DRAM or SRAM), or nonvolatile memory components (such as flash memory or hard drives)) and executed on a computer (e.g., any commercially available computer, including smart phones or other mobile devices that include computing hardware). By way of example and with reference to FIG. 17, computer-readable storage media include memory 1720, memory 1725, and/or storage 1740. The term computer-readable storage media does not include signals and carrier waves. In addition, the term computer-readable storage media does not include communication connections (e.g., 1770).

Any of the computer-executable instructions for implementing the disclosed techniques as well as any data created and used during implementation of the disclosed embodiments can be stored on one or more computer-readable storage media (e.g., non-transitory computer-readable media). The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

In view of the many possible embodiments to which the principles of the disclosed technology may be applied, it should be recognized that the illustrated embodiments are only preferred examples and should not be taken as limiting the scope of the disclosure. We claim all that comes within the scope of the appended claims.

We claim:

1. An imaging system, comprising:
   a modulator situated to generate a modulated image beam of a sample;
   a sensor situated to receive and detect the modulated image beam at a Fourier transform diffraction plane; and
   a processor coupled to the sensor and operable to produce a diffraction image of the sample based on a plurality of detected modulated image beams detected at the diffraction plane.

2. The imaging system of claim 1, wherein the processor is configured to produce the diffraction image as a combined phase and magnitude image.

3. The imaging system of claim 1, wherein the processor is configured to produce the diffraction image as a phase image or a magnitude image.

4. The imaging system of claim 1, wherein the modulator is coupled to modulate a beam focus, a beam displacement with respect to the sample and/or the sensor, or a beam angle of incidence at the sample or the sensor, or an interference between beams.

5. The imaging system of claim 1, wherein the modulator includes at least one mask situated to receive a radiation beam and generate a mask-modulated image beam of the sample corresponding to the modulated image beam and the processor is operable to produce the diffraction image of the sample based on a plurality of detected mask-modulated image beams detected at the diffraction plane.

6. The imaging system of claim 5, wherein the at least one mask comprises a plurality of transmissive and non-transmissive elements having a predetermined width and length, and wherein the modulator is operable to produce a displacement of the radiation beam with respect to the at least one mask by at least the predetermined width or the predetermined length to produce the plurality of mask-modulated image beams.

7. The imaging system of claim 6, wherein the at least one mask is situated to receive the radiation beam and generate the mask-modulated image beam based on a relative displacement of the at least one mask and the sample.

8. The imaging system of claim 7, wherein the at least one mask is situated to receive the radiation beam and generate the mask-modulated image beam based on the relative displacement of the radiation beam and the at least one mask that is proportional to a compression ratio.

9. The imaging system of claim 8, further comprising a receptacle for retaining the sample, wherein the at least one mask is positioned along a path of the radiation beam between the receptacle and the sensor.

10. The imaging system of claim 5, wherein the at least one mask comprises a plurality of masks, and the processor is operable to produce a diffraction image of the sample based on a plurality of detected mask-modulated image beams detected at the diffraction plane and associated with the plurality of masks.

11. The imaging system of claim 1, further comprising a radiation beam source that produces a radiation beam that is directed toward the sample, wherein the radiation beam is one of an X-ray beam, a gamma ray beam, a neutron beam, a charged particle beam (CPB), an infrared beam, and an ultraviolet beam.

12. The imaging system of claim 1, further comprising:
a charged particle beam source situated to direct a charged particle beam to the sample so as to produce a charged particle image beam that corresponds to the modulated image beam; and
at least one mask positioned along a charged particle beam path of the charged particle beam between the charged particle beam source and the sample.

13. The imaging system of claim 12, wherein the modulator further comprises a translation stage configured to displace the at least one mask with respect to the charged particle image beam.

14. The imaging system of claim 13, further comprising a piezoelectric positioner coupled to the at least one mask so as to displace the at least one mask along at least one axis.

15. The imaging system of claim 13, wherein the modulator further comprises a beam deflector configured to scan the charged particle image beam with respect to the at least one mask.

16. The imaging system of claim 15, wherein the beam deflector is configured to scan the charged particle image beam with respect to the at least one mask in a predefined two-dimensional pattern.

17. The imaging system of claim 1, further comprising a lens situated to receive the modulated image beam from the modulator, wherein the sensor is situated to receive the modulated image beam from the lens.

18. A method, comprising:
modulating a radiation image beam to generate at least one modulated image beam;
obtaining a plurality of modulated diffraction images by detecting a plurality of modulated image beams with a sensor array at a back focal plane diffraction plane; and
obtaining a diffraction image of a sample by decompressing the plurality of modulated diffraction images.

19. The method of claim 18, further comprising storing the diffraction image in a computer readable medium.

20. The method of claim 18, wherein the modulation of the radiation image beam is produced by moving at least one mask with respect to the radiation image beam.

21. The method of claim 20, wherein the at least one mask is periodically translated using a positioning stage to produce the modulated image beam.

22. The method of claim 20, wherein the at least one mask comprises a plurality of masks situated to produce the plurality of mask modulated image beams that are detected by the sensor array so as to obtain the plurality of mask-modulated diffraction images.

23. The method of claim 18, wherein the radiation image beam is a charged particle beam (CPB) and the modulation of the radiation image beam is applied by moving the radiation image beam with an electrostatic or magnetic beam deflector.

24. The method of claim 23, wherein the moving of the CPB is across at least one mask in a predefined two-dimensional pattern.

25. The method of claim 18, wherein the modulating the radiation image beam to generate the at least one modulated image beam is performed by modulating a beam focus, beam current, beam position, sample position, or sample tilt.

26. The imaging system of claim 18, wherein the diffraction image is a combined phase and magnitude image.

27. The imaging system of claim 18, wherein the diffraction image is a phase image or a magnitude image.

28. The method of claim 18, further comprising directing the plurality of modulated image beams to a lens, wherein the diffraction plane is a diffraction plane associated with the lens.

29. A transmission electron beam microscope, comprising:
a beam source configured to emit an electron beam;
a sample receptacle for receiving a sample so as to be irradiated by the electron beam and produce an image beam;
at least one modulator situated to receive the electron beam from the beam source or the image beam from the sample, the modulator operable to produce at least one modulated image beam; and
an imaging system situated to receive the at least one modulated image beam at a diffraction plane, and produce a magnitude, phase, or combined magnitude and phase diffraction image of the sample.

* * * * *